(12) United States Patent
Nakamura et al.

(10) Patent No.: US 6,887,724 B2
(45) Date of Patent: May 3, 2005

(54) TEST ELEMENT GROUP, METHOD OF MANUFACTURING A TEST ELEMENT GROUP, METHOD OF TESTING A SEMICONDUCTOR DEVICE, AND SEMICONDUCTOR DEVICE

(75) Inventors: Osamu Nakamura, Kanagawa (JP); Mai Akiba, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 156 days.

(21) Appl. No.: 10/218,035

(22) Filed: Aug. 14, 2002

(65) Prior Publication Data
US 2003/0049874 A1 Mar. 13, 2003

(30) Foreign Application Priority Data
Aug. 24, 2001 (JP) ........................................ 2001-254685

(51) Int. Cl.$^7$ ............................................... G01R 31/26
(52) U.S. Cl. ......................................... 438/14; 438/164
(58) Field of Search ........................... 438/14, 149, 157, 438/163, 164, 166, 96, 368, 766

(56) References Cited

U.S. PATENT DOCUMENTS

| 5,643,826 A | 7/1997 | Ohtani et al. |
| 6,365,933 B1 | 4/2002 | Yamazaki et al. |
| 2003/0089905 A1 * | 5/2003 | Udagawa et al. ............. 257/40 |

| 2003/0116811 A1 * | 6/2003 | Fukui ........................ 257/410 |

FOREIGN PATENT DOCUMENTS

| JP | 02300676 A | * 12/1990 | ................. 324/768 |
| JP | 07-130652 | 5/1995 | |
| JP | 08-78329 | 3/1996 | |
| JP | 10-135468 | 5/1998 | |
| JP | 10-135469 | 5/1998 | |

OTHER PUBLICATIONS

"Theory of phonon dispersion relations in semiconductor superlattices", Yip and Chang, Phys. Rev. B 30, 7037–7059 (1984), [Issue Dec. 12–15, 1984].*

* cited by examiner

*Primary Examiner*—Ernest Karlsen
*Assistant Examiner*—Lisa Kilday
(74) *Attorney, Agent, or Firm*—Fish & Richardson P.C.

(57) ABSTRACT

To provide a TEG capable of early stage feedback of testing contents and a method of testing using the TEG. TFTs for TEG are manufactured on a different substrate than actual panel TFTs by using from among processes for manufacturing actual panel TFTs, processes that may easily lead to dispersion in the TFT characteristics, and the minimum number of processing steps necessary for TFT manufacture. The number of processing steps is fewer than the number for the actual panel, and therefore it is possible to complete the TFTs for TEG quicker than those of the actual panel, and it becomes possible to feed back an evaluation of the TEG TFT characteristics to the actual panel manufacturing process at an early stage. Time and costs associated with manufacture of the actual panel can therefore be suppressed.

8 Claims, 16 Drawing Sheets

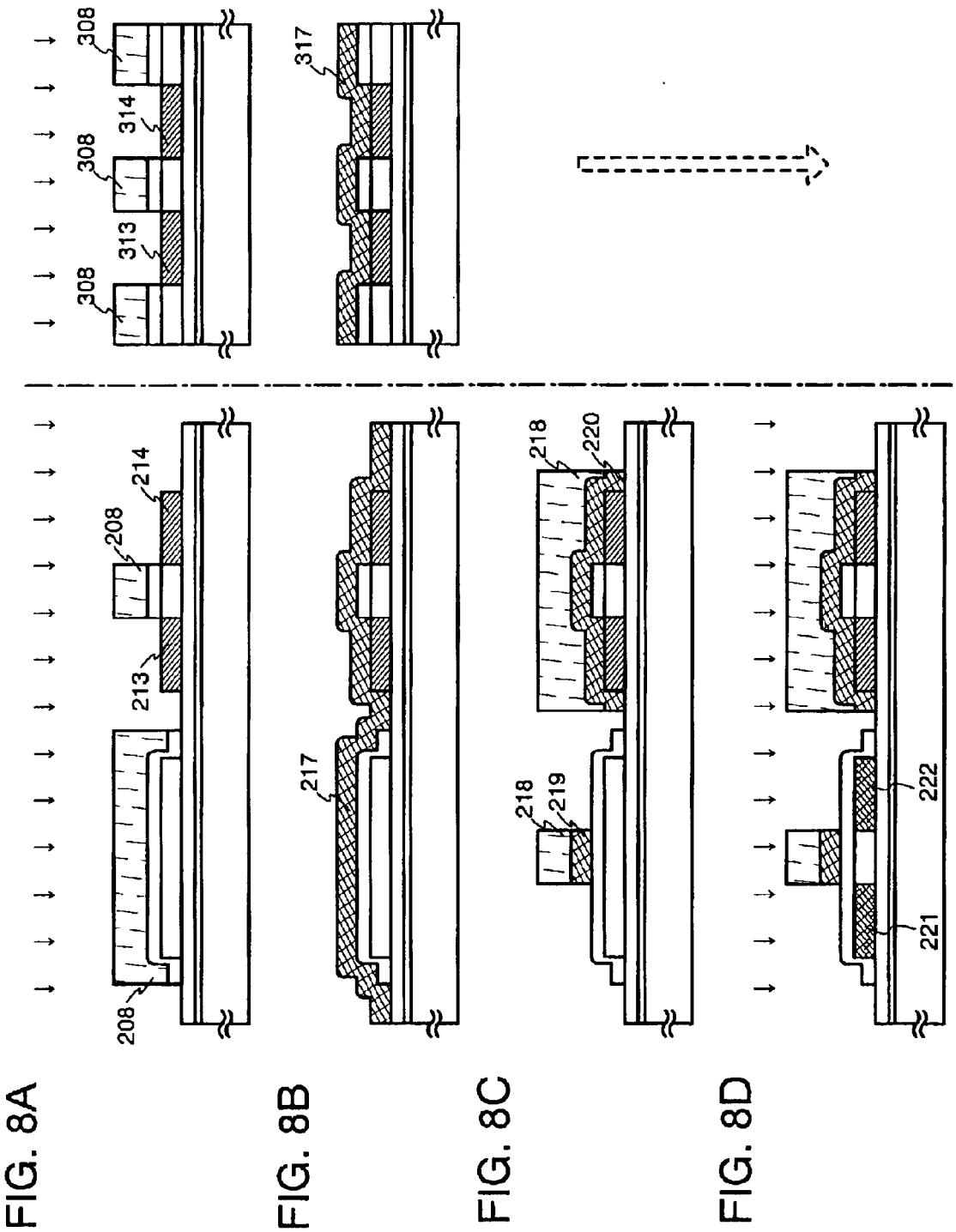

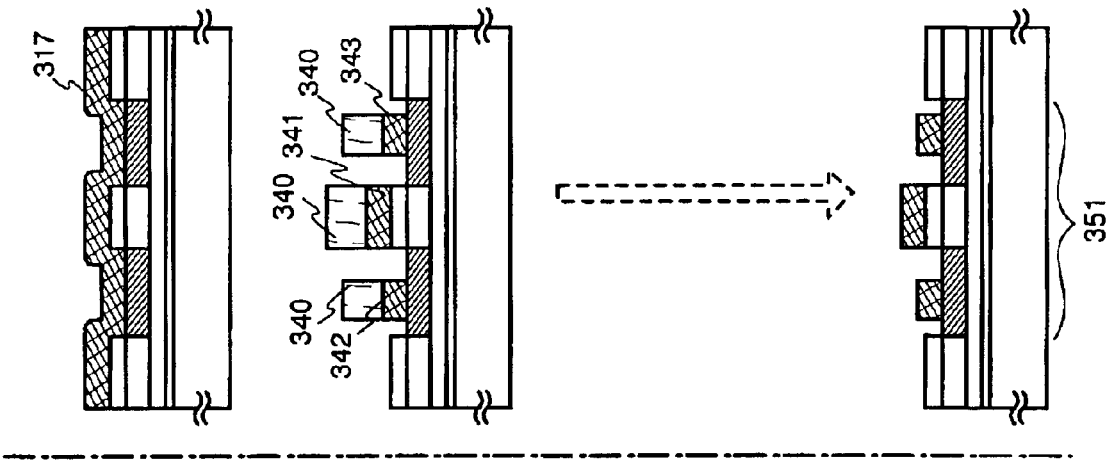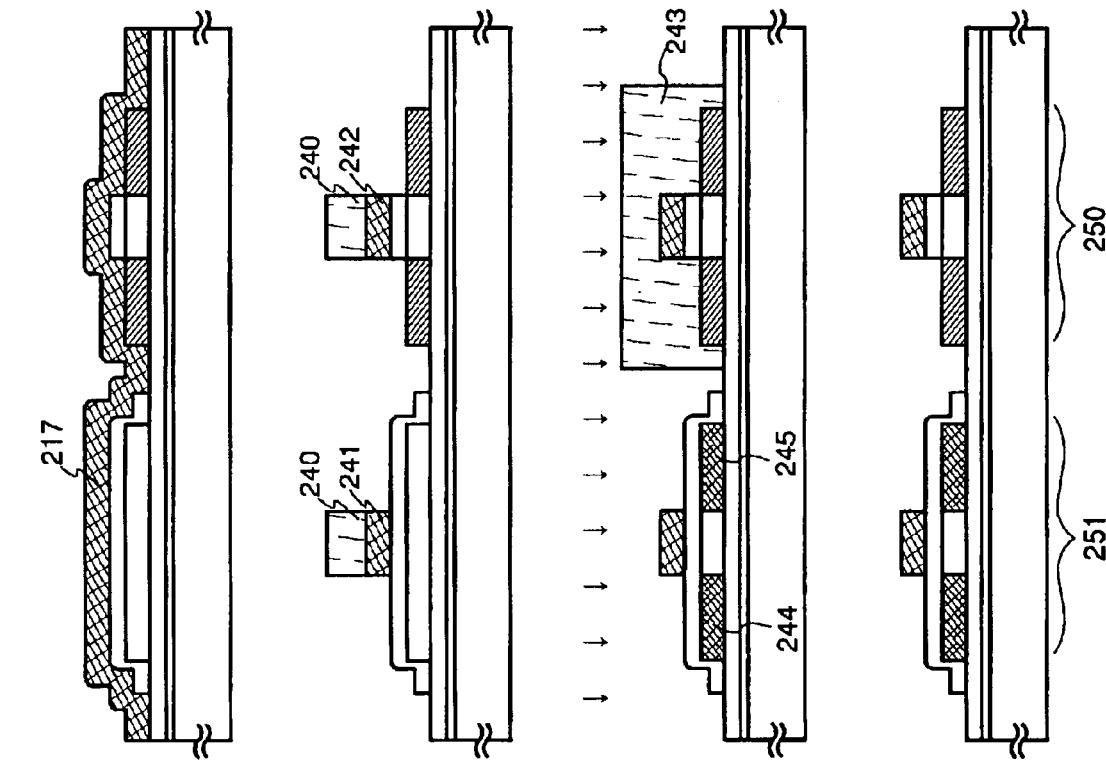
FIG. 10A
FIG. 10B
FIG. 10C
FIG. 10D

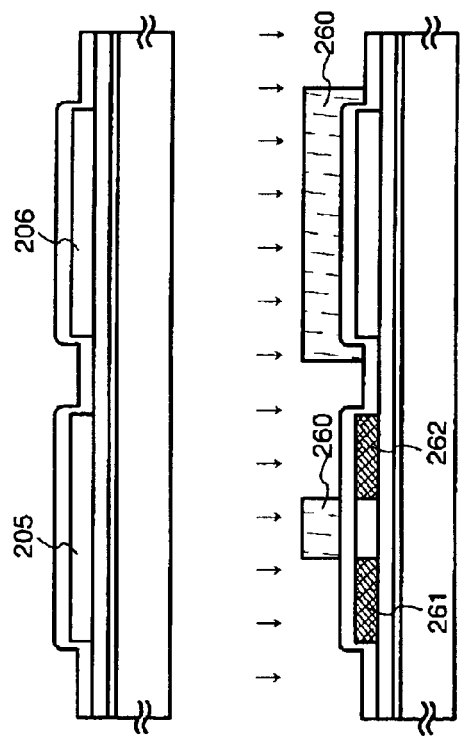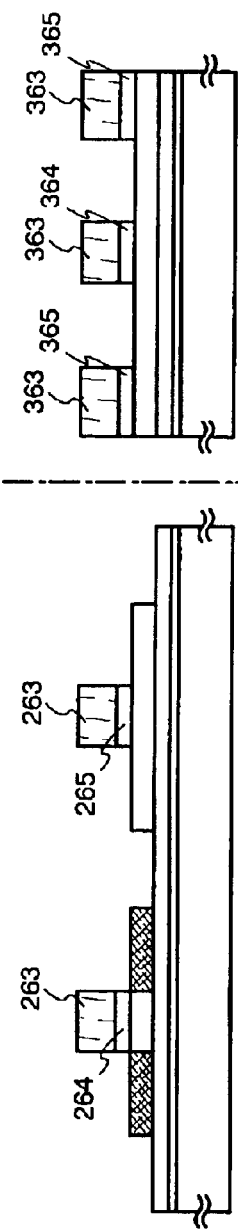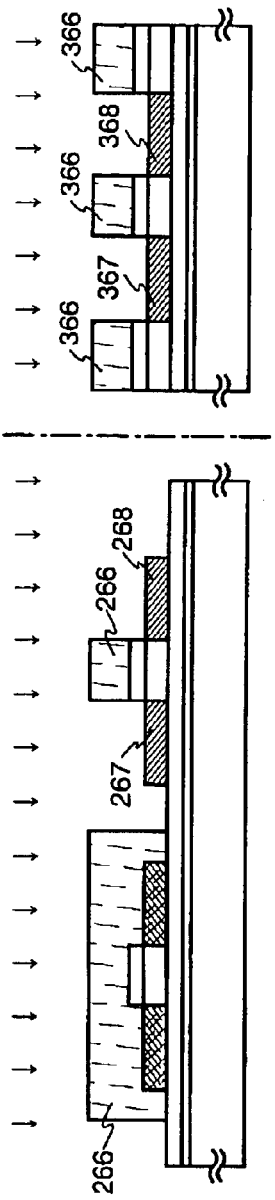
FIG. 11A
FIG. 11B
FIG. 11C
FIG. 11D

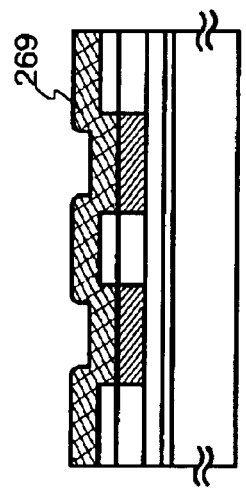
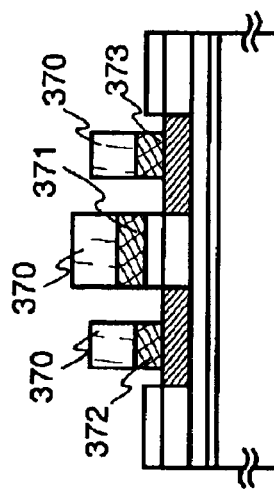
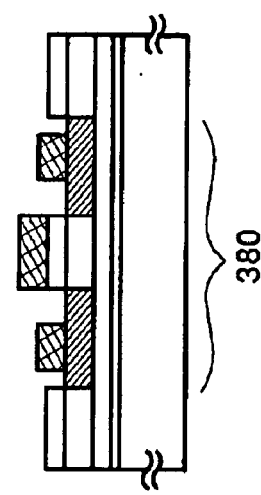
FIG. 12A
FIG. 12B
FIG. 12C

TEST ELEMENT GROUP, METHOD OF MANUFACTURING A TEST ELEMENT GROUP, METHOD OF TESTING A SEMICONDUCTOR DEVICE, AND SEMICONDUCTOR DEVICE

BACKGROUND OF THE INVENTION

1. Field of the Invention

The present invention relates to a test element group (TEG) made from a plurality of testing elements for evaluating the characteristics of a thin film transistor (TFT). Further, the present invention relates to a method of manufacturing the TEG, to a method of testing the electrical characteristics of a semiconductor device by using the TEG, and to a semiconductor device tested by using the TEG.

2. Description of the Related Art

Techniques of forming thin film transistors (TFTs) by using semiconductor films (thickness on the order of several nm to several hundreds of nm) formed on a substrate having an insulating surface have been in the spotlight in recent years. The reason for this is the increase in demand for active matrix semiconductor display devices as one type of semiconductor device. Active matrix semiconductor display devices typically include liquid crystal displays, OLED (organic light emitting device) displays, DMDs (digital micro-mirror devices), and the like.

A high mobility can be obtained for TFTs (crystalline TFTs) that use semiconductor films having a crystalline structure as an active layer, and therefore it is possible to realize an active matrix semiconductor display device for performing display of a high definition image by the integration of functional circuits on the same substrate.

The crystalline TFTs are completed through a variety of manufacturing processes. Processes typically have a formation of a base film in order to prevent impurities within a substrate from incurring to a semiconductor film, a formation and crystallization of the semiconductor film, patterning of the semiconductor film, a formation of a gate insulating film, a formation of source/drain regions by adding impurities that impart a conductivity to the semiconductor film, a formation of a gate electrode, and a formation of electrodes connected to the source/drain regions as main processes.

The TFT characteristics such as on current, mobility, S-value, threshold value, and off current differ in some cases due to accidental causes, such as the impurity concentration within the apparatus at the time of manufacture, and the conduction of manufacturing apparatus, even if the same apparatus is used for the aforementioned manufacturing processes under the same conditions. In the worst case, a defect will develop in one of the aforementioned processes, and there will be significant deterioration in the TFT characteristics.

It is therefore very important to control the TFT characteristics of display panels at an early stage, before product manufacturing is complete, in order to reduce costs. Manufacturing conditions can be reexamined, and separate processes can be added for improving the TFT characteristics, provided that the TFT characteristics are controlled at an early state. Further, if the TFT characteristics have deteriorated significantly and the display panel is judged not usable as a manufactured product, then subsequent processing steps relating to that panel can be omitted, and an yield can be improved.

Testing of the TFT characteristics during the TFT manufacturing processes is generally performed using a TEG. TEGs are separate and independent elements used exclusively for evaluation. The element characteristics can be examined in more detail by using a TEG, and in addition, destructive testing by high stress application, which is impossible to perform on an actual display panel, can be performed with a TEG.

Further, it is possible to search for optimal conditions during manufacturing processes for TFTs used as a panel (actual panel TFTs) by examining the characteristics of TFTs manufactured under various conditions.

As discussed above, the feedback of evaluations obtained by testing the TEG to the manufacturing process of actual panel TFTs, is an extremely effective means when seen from the point of view of cost reduction.

However, the TFTs used for the TEG are generally manufactured by nearly the same processes as used for actual panel TFTs. It is therefore necessary to complete the actual panel TFTs as well as the TFTs for TEG, to a level at which their characteristics can be tested, in order to evaluate the characteristics of the actual panel TFTs by using the TEG.

Accordingly, the TFT characteristics cannot be tested until the actual panel TFTs are complete, and the time and costs for the panel manufacturing processes cannot be reduced, if some type of defect develops during crystallization of the semiconductor film, for example.

Furthermore, it is vital to have immediate feedback of the TEG testing results to the actual panel manufacturing process also for cases in which the optimal conditions for the actual panel manufacturing process are being sought by examining the characteristics of TEGs manufactured under various manufacturing conditions.

SUMMARY OF THE INVENTION

In view of the problems discussed above, an object of the present invention is therefore to provide a TEG capable of early feedback of testing contents, and a testing method using the TEG.

The applicants of the present invention considered that a TEG capable of testing the characteristics of actual panel TFTs can be manufactured without using the completely identical processes as those used for the actual panel TFTs. The applicants of the present invention also considered TFTs for TEG manufactured on a different substrate from that of the actual panel TFTs by using from among the processes for manufacturing the actual panel TFTs, processes which may easily cause dispersion in the TFT characteristics, and the minimum number of processing steps necessary to manufacture the TFTs.

Specifically, a process of manufacturing a TEG of the present invention has a step of forming a semiconductor film, a step of forming a gate insulating film, a step of adding an impurity that imparts one conductivity type to the semiconductor film, and a step of forming a gate electrode. In addition, in order to form electrodes (source electrode and drain electrode) connected to impurity regions formed in the semiconductor film by using the same conductive film as that of the gate electrode, the TEG manufacturing process of the present invention also has a step of etching the gate insulating film before forming the gate electrode, exposing portions of the semiconductor film which will become the impurity regions.

The actual panel TFTs and the TFTs for TEG will differ in structures, such as shape and impurity concentration in the semiconductor film, and there is a good chance that their characteristics will also differ. However, the processing steps that may easily cause dispersion in the characteristics are common between both sets of TFTs, and therefore dispersion in the actual panel TFTs can be predicted from the dispersion in the characteristics of the TFTs for TEG.

Further, the number of processing steps is fewer than needed for the actual panel, and therefore it is possible to complete the TFTs for TEG quicker than those of the actual panel, and it becomes possible to feed back the evaluation of the TEG TFT characteristics very quickly to the process of manufacturing the actual panel. The amount of time required for the process of manufacturing the panel, and the attendant costs, can thus be suppressed.

Furthermore, the TEG may be formed within the panel used as the actual panel with the present invention, and the TEG may also be formed on a different substrate than that of the actual panel. The relative dispersion in the TEG characteristics and the relative dispersion in the actual panel characteristics can be made to more certainly have good agreement with each other by forming the TEG within the panel used as the actual panel. Further, it is not necessary to consider the amount of surface area occupied by the TEG in the actual panel if the TEG is formed on a substrate that differs from that of the actual panel, and costs can be reduced.

BRIEF DESCRIPTION OF THE DRAWINGS

In the accompanying drawings:

FIGS. 8A to 8D are diagrams showing the process of manufacturing a TEG and an actual panel;

FIGS. 10A to 10D are diagrams showing the process of manufacturing a TEG and an actual panel;

FIGS. 11A to 11D are diagrams showing the process of manufacturing a TEG and an actual panel;

FIGS. 12A to 12C are diagrams showing the process of manufacturing a TEG and an actual panel;

DETAILED DESCRIPTION OF THE PREFERRED EMBODIMENTS

Embodiment Mode

The structure of TFTs used in a TEG of the present invention, and a method of manufacturing the TFTs are explained using FIGS. 1A to 1D and FIGS. 2A to 2D. Note that FIGS. 1A to 1D are top views showing a process of manufacturing a TEG, and FIGS. 2A to 2D are cross sectional diagrams along a line segment A–A'.

Figure 1A:
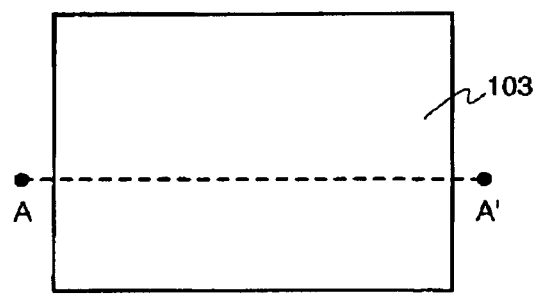
FIGS. 1A to 1D are diagrams showing a process of manufacturing a TEG of the present invention.
Figure 2A:
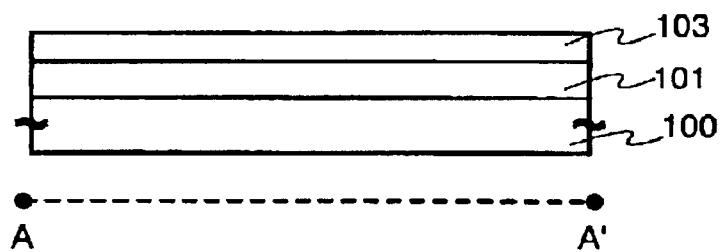
FIGS. 2A to 2D are diagrams showing a process of manufacturing a TEG of the present invention.

A semiconductor film 101 is formed on a substrate 100, as shown in FIGS. 1A and 2A. A material able to withstand the processing temperature of later processing steps may be used for the substrate 100. It is not necessary to use the same material for the TEG substrate as that used for the actual panel substrate. However, the relative dispersion in the TEG characteristics and the relative dispersion in the characteristics of the actual panel can be made to have good agreement with each other by using the same material for both substrates.

Further, there are cases in which the semiconductor film is formed after forming a base film from an insulating film on the substrate, in order to prevent hurtful impurities within the substrate from diffusing to the semiconductor film. In this case, the relative dispersion in the TEG characteristics and the relative dispersion in the characteristics of the actual panel can be made to more certainly have good agreement with each other by also forming the base film under the TEG.

If the same material is used for the TEG semiconductor film as that used for the semiconductor film of the actual panel, and if the film formation conditions are the same, then the same apparatus is used, and the films are formed by the same film formation method. The relative dispersion in the TEG characteristics and the relative dispersion in the actual panel characteristics can be made to more certainly have good agreement with each other in accordance with the aforementioned structure.

Note that there are cases in which a process for increasing the crystallinity of a non-single crystalline semiconductor film formed in the actual panel is used. In this case, the relative dispersion in the characteristics of the TEG and the relative dispersion in the actual panel characteristics may also be made to more certainly have good agreement with each other by performing the process for increasing the crystallinity using the same crystallization method, performed under the same conditions and using the same apparatus, for the TEG as well as the actual panel.

Further, for cases in which a process for adding an impurity that imparts a conductivity to the semiconductor film 101 is used in order to control the threshold value voltage in the actual panel, the same process may also be performed for the TEG.

An insulating film 103 is then formed on the semiconductor film 101. The insulating film 103 is formed using the same material as that used for a gate insulating film of the actual panel, under the same film formation conditions, using the same apparatus, and by the same film formation method. In accordance with the above structure, the relative dispersion in the TEG characteristics can be made to more certainly have good agreement with the relative dispersion in the characteristics of the actual panel.

Figure 1B:
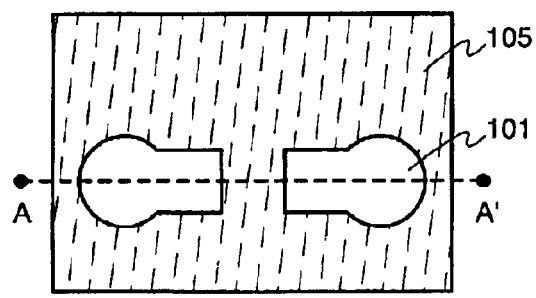
Figure 2B:
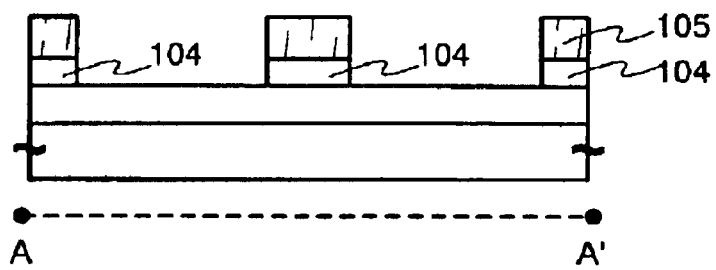

The insulating film 103 is patterned next using a mask 105, forming a gate insulating film 104 as shown in FIG. 1B and FIG. 2B. A portion of the semiconductor film 101 is exposed by this patterning. Note that a portion of the semiconductor film 101 which serves as a channel formation region is covered by the gate insulating film 104.

Figure 1C:
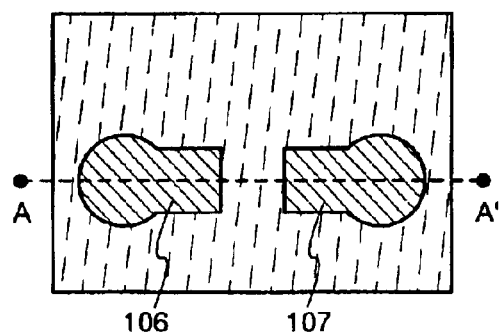
Figure 2C:
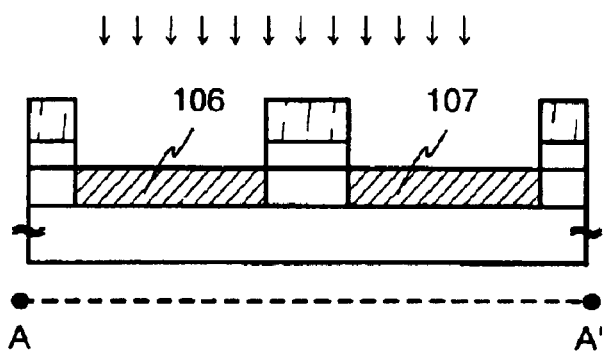

An impurity that imparts a conductivity is then added to the semiconductor film 101 using the mask 105, as shown in FIG. 1C and FIG. 2C. The impurity is added from the exposed portion of the semiconductor film 101 by the above stated process, forming a source region 106 and a drain region 107. Note that, although it is preferable that the impurity addition process be performed under the same conditions as those of the impurity addition process for the actual panel, the conditions need not be exactly the same.

Note that there are cases in which a plurality of processes for adding impurities to the semiconductor film are used in order to form an LDD region having a lower impurity concentration than that of the source and drain regions in the actual panel. It is not necessary that all of the processes for adding the impurity element to the actual panel be performed for the TEG in this case. At least, the process for adding the largest amount of impurity should be performed for the TEG. For cases of performing several of the actual panel impurity addition processes for the TEG, the actual panel TFTs and the TFTs for TEG will have different impurity concentrations in the source region 106 and the drain region 107, and therefore the TFT characteristics will also differ. However, the relative changes relating to the dispersion in the characteristics of the actual panel TFTs and the TFTs for TEG caused by common processes can be made to agree well with each other.

A conductive film is formed next, after removing the mask 105, so as to cover the gate insulating film 104, the source region 106, and the drain region 107. The conductive film uses the same material as that of the actual panel gate electrode, and is formed under the same film formation conditions, using the same apparatus, and by the same film formation method. The relative dispersion in the TEG characteristics and the relative dispersion in the characteristics of the actual panel can be made to more certainly have good agreement with each other in accordance with this structure.

Figure 1D:
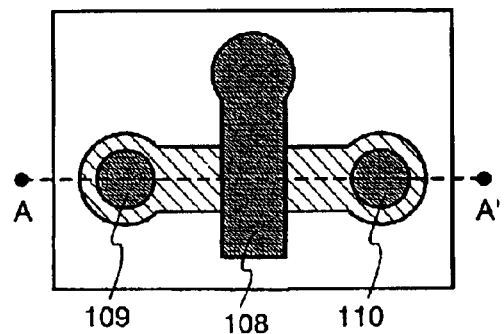
Figure 2D:
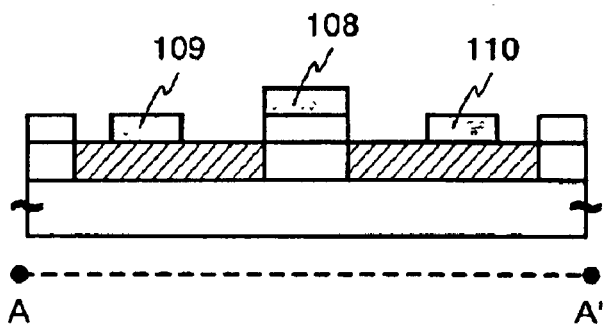

A gate electrode 108 contacting the gate insulating film 104, a source electrode 109 contacting the source region 106, and a drain electrode 110 contacting the drain region 107 are then formed as shown in FIG. 1D and FIG. 2D by patterning the conductive film. Note that it is not necessary to form the source electrode and the drain electrode at the same time of formation of the gate electrode in the actual panel. The source electrode and the drain electrode may also be formed using a different conductive film in a later process.

Note that, although the source electrode 109 and the drain electrode 110 do not contact the gate insulating film 104 in FIGS. 1D and 2D, the source electrode 109 and the drain electrode 110 may also be formed so as to ride on top of a portion of the gate insulating film 104. In this case it is possible to use the source electrode 109 and the drain electrode 110 as TEG measurement terminals as is.

Furthermore, considering shifts in the mask, an offset region may also be formed so that the gate electrode 108 does not contact the source region 106 and the drain region 107.

A process such as heat treatment may be performed after forming the source electrode and the drain electrode in order to activate the impurity element. This process may be performed by thermal annealing using an electric heating furnace, laser annealing using an excimer laser, or rapid thermal annealing (RTA) using a halogen lamp. However, activation can be performed at a low substrate heating temperature with the laser annealing method, but it is difficult to perform activation of the region underneath the gate electrode. Activation is therefore performed by thermal annealing here. The heat processing is performed for two hours within a nitrogen atmosphere at a temperature of 300 to 700° C., preferably between 350 and 550° C., and it is performed at 450° C. here.

From 3 to 90% hydrogen may also be added within the nitrogen atmosphere in order to have the hydrogen compensate for defects within the semiconductor layer, and defects remaining in boundaries with the semiconductor layer during this heat treatment process, thus improving the TFT characteristics. Further, hydrogenation processing may also be performed for 2 to 12 hours at a temperature of 150 to 500° C., preferably between 300 and 450° C., within a 3 to 100% hydrogen atmosphere after the heat treatment process. Furthermore, hydrogen plasma processing may also be performed at a substrate temperature of 150 to 500° C., preferably between 200 and 450° C.

The TEG of the present invention is complete when the aforementioned processes are finished. Probes are placed on the gate electrode 108, the source electrode 109, and the drain electrode 110 after the TEG is completed, voltage is applied, electric current is made to flow, and the characteristics of the TFTs for TEG are examined.

Note that it is preferable to change the process of manufacturing the TEG depending upon what one wishes to monitor in the actual panel. For example, for cases of monitoring the TFT mobility in the actual panel, it is preferable to add a process for crystallizing the semiconductor film, which is thought to have an influence on mobility, to the process of manufacturing the TEG if the process is included in the process of manufacturing the actual panel. At this time, the process of crystallizing the semiconductor film in the TEG may be performed under the same conditions as that used for the actual panel TFTs. Further, for cases of monitoring the threshold value of the actual panel TFTs, it is preferable to add a process of impurity addition to the channel formation region, which is thought to have an influence on the threshold value, to the process of manufacturing the TEG if the process is included in the process of manufacturing the actual panel.

Figure 3:
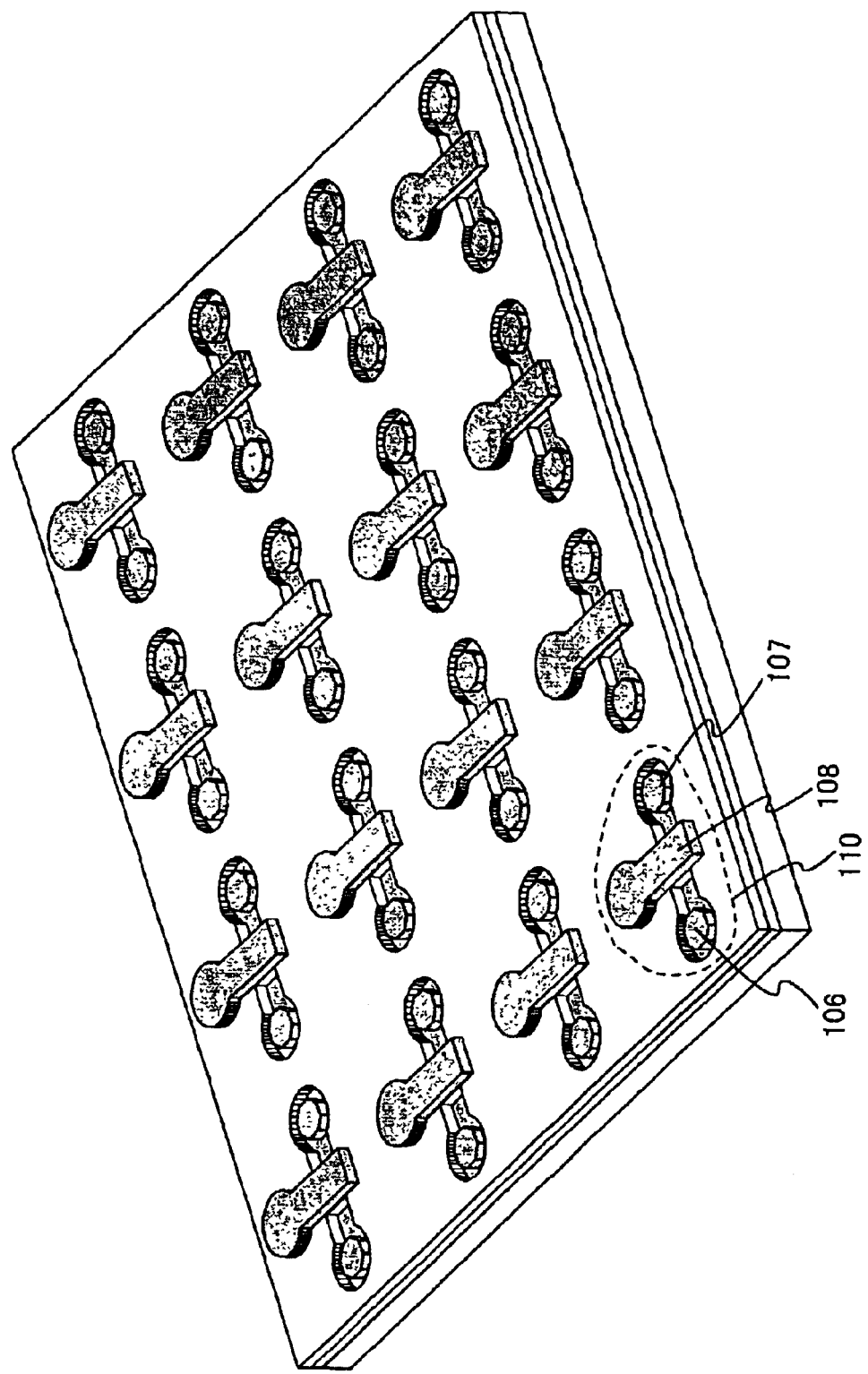
FIG. 3 is a diagram showing a perspective view of a TEG of the present invention.

Note that while only one unit element is shown in FIGS. 1A to 1D and FIGS. 2A to 2D, TFTs for a plurality of the unit elements can be formed at the same time on one substrate by using the processes shown in FIGS. 1A to 1D and FIGS. 2A to 2D. A perspective diagram of a TEG in which a plurality of unit elements are formed on one substrate is shown in FIG. 3. A plurality of the TFTs 110 are formed as the unit elements in FIG. 3, and each of the unit elements 110 has the source electrode 106, the drain electrode 107, and the gate electrode 108.

Furthermore, although the channel width, the channel length, and other sizes are set to be the same for each of the unit elements in FIG. 3, it is possible for a designer to arbitrarily set these sizes in accordance with the size of the actual panel TFTs which are being examined, and with the goal of the examination.

Figure 4:
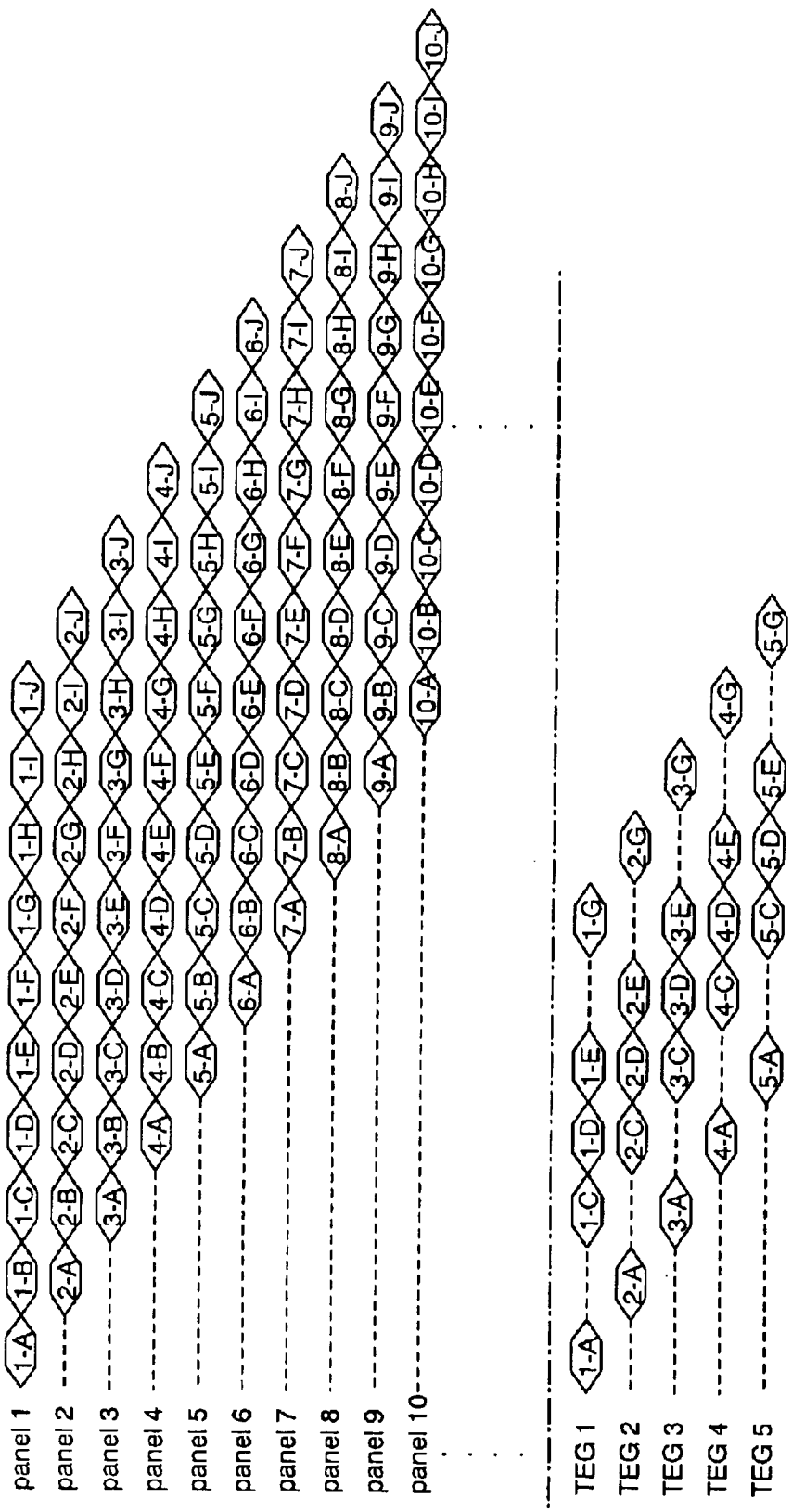
FIG. 4 is a diagram showing manufacturing process order for a TEG and an actual panel.

Actual panel and TEG processes and a method of comparing the characteristics are explained next. FIG. 4 shows the relative relationship between the processes for the actual panel and the TEG of the present invention. The horizontal axis shows time.

It is assumed that 10 processes A to J are used for completing up through the source electrodes and the drain electrodes in the actual panel. Note that, although an example is used in which 10 processing steps are established here for the actual panel in order to simplify the explanation, in practice there are no limitations placed on the number of processing steps for the actual panel.

The TEG is then completed up through the source electrodes and the drain electrodes through five processes that are in common with those of the actual panel, that is, the processing steps A, C, D, E, and G. Note that, specifically, the following processing steps are performed in the Embodiment Mode: a semiconductor film is formed in the process A; an insulating film that serves as a gate insulating film is formed in the process C; the insulating film is etched, forming the gate insulating film and exposing a portion of the semiconductor film in the process D; an impurity that imparts one conductivity type is added to the exposed portion of the semiconductor film, thus forming an impurity region, in the process E; and gate electrodes, source electrodes, and drain electrodes are formed in the process G.

Note that only the gate electrodes are formed by the process G for the actual panel in FIG. 4. The source electrodes and the drain electrodes are not formed.

Note that, in practice, processing steps for forming a mask, removing the mask, substrate cleaning, etc., are formed in addition to the aforementioned processing steps, similar to the actual panel. These additional processes are omitted in this Embodiment Mode in order to simplify the explanation, and only the processes A, C, D, E, and G are shown. Further, other processing steps such as addition of an impurity in order to control the threshold value and semiconductor film crystallization may also be used, similar to those of the actual panel, in addition to those processes described above.

In order to simplify the explanation in the Embodiment Mode, a process for forming a conductive film, and a process for forming gate electrodes, source electrodes, and drain electrodes by etching the conductive film after it is formed, are combined into one process and shown as the process G.

Reference numbers attached to each panel in FIG. 4 denote lot numbers. The term "lot" indicates a group of panels moved and processed together through the processing steps, and denotes a production unit or a shipping unit. Reference numerals attached to each TEG also denote lot numbers, and actual panels and TEGs having the same lot numbers belong to the same lot.

The processes A to J for each panel are shown separately for each lot. For example, the processes A to J for a panel m are shown as processes m-A to m-J. Processes m-A, m-C, m-D, m-E, and m-G, corresponding to those of the panel m, are used for a TEG m.

Processes for examining the characteristics of the TFTs of each TEG are performed at the point in FIG. 4 at which the process G is completed in each lot. If the examined TEG characteristics are shifted greatly from those of other TEGs, then it can be predicted that the characteristics of the actual panels belonging to the same lot will also show a large shift.

Figure 5:
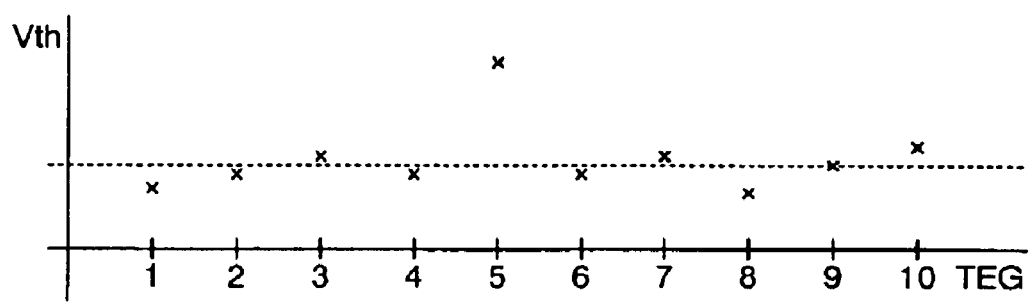
FIG. 5 is a graph showing a state in which the threshold value of a TEG is shifted.

A threshold voltage Vth for the TFTs of each TEG is shown in FIG. 5. Lot number is shown in the horizontal axis, and Vth for the TFTs of each TEG is shown in the vertical axis. Note that, Vth can be considered to differ for each TFT for cases in which a plurality of TFTs of differing sizes are formed in each TEG. FIG. 5 is a diagram produced under the assumption of cases in which Vth is examined only for TFTs having the same design in each TEG.

Vth for the number 5 TEG differs remarkably from that of the other TEGs in FIG. 5, and therefore it can be predicted that the characteristics of the actual panels in the number 5 lot will also differ remarkably when compared with the other actual panels. Note that although the focus of FIG. 5 is made on Vth as a TFT characteristic, other characteristics in addition to Vth, for example the on electric current, mobility, S value, and the off electric current may also be compared. It is possible for the operator to suitably determine standards according to which it is judged that the characteristics differ greatly.

Absolute shifts in the characteristics of the TEG and absolute shifts in the characteristics of the actual panel are not always in agreement with each other. However, the TEG and the actual panel can be considered to be nearly in agreement with the other in lots that show a large relative shift, and therefore the characteristics of the actual panel can be predicted by examining the characteristics of the TEG. It is possible to more reliably predict the characteristics of the actual panel in advance from the characteristics of the TEG by examining the relative correlation of the shifts in the characteristics of the TEG and the actual panel.

The processes H, I, and J may be performed without change after the process G for cases in which it is determined that there are no predicted problems with the characteristics of the actual panel in the examination. If it is determined that some problems with the characteristics of the actual panel exist, then processes other than the processes H, I, and J can be added, and an yield can be increased. Further, for cases in which it is determined that the actual panel cannot withstand the service as a manufactured product, it is possible to omit later processes relating to the panel, and time and costs required in the manufacturing process can be suppressed. In addition, feedback to the immediate subsequent lot of actual panels can be performed if the predicted characteristics of the actual panel in the examination are all unpreferable. Specifically, the processing conditions for subsequent lots can be reconsidered, and separate processes can be added in order to improve the TFT characteristics.

Figure 6:
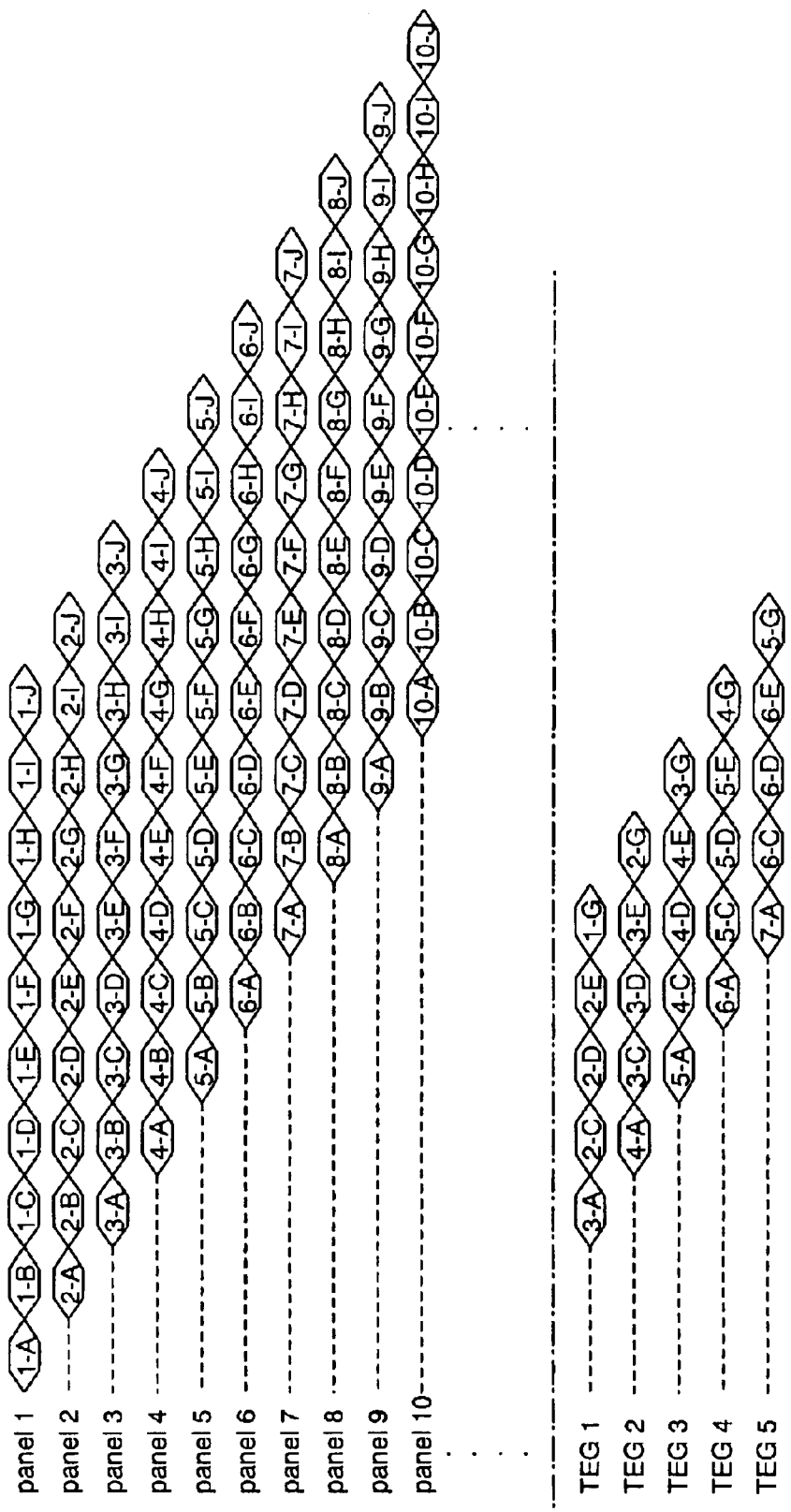
FIG. 6 is a diagram showing manufacturing process order for a TEG and an actual panel.

Note that, although a TEG is formed in each lot in FIG. 4, the present invention is not limited to this structure. A correlation between the actual panel processes and the TEG processes, which differs from that of FIG. 4, is shown in FIG. 6. The horizontal axis shows time.

It is assumed that the 10 processes A to J are used in FIG. 6 in completing the source electrodes and the drain electrodes in the actual panel, similar to FIG. 4. Note that, although an example is used in which 10 processing steps are established here for the actual panel in order to simplify the explanation, in practice there are no limitations placed on the number of processing steps for the actual panel.

The TEG is then completed up through the source electrodes and the drain electrodes through five processes that are in common with those of the actual panel, that is, the processing steps A, C, D, E, and G. The content of each process is the same as in FIG. 4.

Note that, similar to FIG. 4, only the gate electrodes are also formed by the process G for the actual panel in FIG. 6. The source electrodes and the drain electrodes are not formed.

In practice, processing steps for forming a mask, removing the mask, substrate cleaning, etc., are formed in addition to the aforementioned processing steps, similar to the actual panel. These additional processes are omitted in this Embodiment Mode in order to simplify the explanation, and only the processes A, C, D, E, and G are shown. Further, other processing steps such as addition of an impurity in order to control the threshold value and semiconductor film crystallization may also be used, similar to those of the actual panel, in addition to those processes described above.

Similar to FIG. 4, the numerals attached to each panel in FIG. 6 denote lot numbers.

Differing from FIG. 4, however, the numerals attached to each TEG in FIG. 6 do not correspond to the lot numbers, and the lot to which a TEG belongs differs by the TEG processes. For example, a TEG m in FIG. 6 has a process (m+2)-A, corresponding to that for a panel m+2, processes (m+1)-C, (m+1)-D, and (m+1)-E, corresponding to that for a panel m+1, and a process m-G, corresponding to that for the panel m.

Note that although the processes (m+2)-A, (m+1)-C, (m+1)-D, (m+1)-E, and m-G are consecutive in time in FIG. 6, it is not always necessary that the TEG processes be consecutive in time.

Examination of the TFT characteristics is performed at the point in FIG. 6 at which the process m-G is complete. Note that it cannot always be said that the characteristics of one TEG correspond to the one lot of the actual panels if the TEG is manufactured by the processes shown in FIG. 6. For example, the TEG m corresponds to the three lots m+2, m+1, and m.

However, for cases in which the conditions are changed in a specific process for each lot in order to find the optimal conditions, the actual panel characteristics can be predicted from the TEG, and therefore the manufacturing conditions for subsequent lots can be determined at an early stage. With the TEG of FIG. 6, film formation may be performed in the process C by changing the film formation conditions in each lot, for example, in order to find the optimal film formation conditions for the insulating film that serves as the gate insulating film in the process C. Then, for example, if the actual panel of a number 2 lot (a panel 2) and the TEG1 have the same film formation conditions for the gate insulating film, then the characteristics of the panel 2 can be predicted from the characteristics of the TEG1.

Note that absolute shifts in the characteristics of the TEG and absolute shifts in the characteristics of the actual panel are not always limited to being in agreement. The relative shift in the characteristics due to different processing conditions can be considered to be nearly the same for the TEG and the actual panel, and therefore the characteristics of the actual panel can be predicted by examining the TEG characteristics. It is possible to more reliably predict the characteristics of the actual panel in advance from the characteristics of the TEG by examining the relative correlation of the shifts in the characteristics of the TEG and the actual panel.

Note that the amount of wasted time during manufacture of the TEGs made by the process of manufacturing shown in FIG. 6 can be made less than the amount of time wasted during manufacture of the TEGs made by the process of manufacturing shown in FIG. 4. The examination results can therefore be fed back to the actual panels very quickly.

Embodiments

Embodiments of the present invention are explained below.

[Embodiment 1]

A method of manufacturing actual panel TFTs and TFTs for TEG is explained in Embodiment 1. Note that a method of manufacturing n-channel TFTs and p-channel TFTs is shown for the actual panel, while a method of manufacturing n-channel TFTs is shown for the TEG. Although a TEG having n-channel TFTs is introduced in Embodiment 1, it is also possible to manufacture a TEG having p-channel TFTs.

A substrate 201 and a substrate 301 are prepared. The substrate 201 is used for the actual panel, and the substrate 301 is used for the TEG. The actual panel and the TEG shown in Embodiment 1 may belong to the same lot, and may also belong to lots that are separate due to processing.

Glass substrates, plastic substrates, ceramic substrates, and the like can be used for the substrate 201 and the substrate 301. Further, silicon substrates having an insulating film formed thereon such as silicon oxide or silicon nitride is formed, and metal substrates, typically stainless steel substrates, may also be used. It is also possible, or course, to use quartz substrates.

A base film 202 made from a silicon nitride film, and a base film 203 made from a silicon oxide film are formed on a main surface of the substrate 201, on which the TFTs are formed. Further, a base film 302 made from a silicon nitride film, and a base film 303 made from a silicon oxide film are formed on a main surface of the substrate 301, on which the TFTs are formed.

The base films 202, 203, 302, and 303 are formed by plasma CVD or sputtering, and are provided in order to prevent impurities harmful to the TFTs from diffusing from the substrate 201 and the substrate 301 to semiconductor layers. The base films 202 and 302 made from the silicon nitride films may therefore be formed having a thickness of 20 to 100 nm, typically 50 nm, and in addition, the base films 203 and 303 made from the silicon oxide films may be formed having a thickness of 50 to 500 nm, typically between 150 and 200 nm.

Of course only one set of base films may also be formed, either the base films 202 and 302 made from the silicon nitride films or the base films 203 and 303 made form the silicon oxide films. However, considering TFT reliability, it is found that using a two-layer structure is most preferable.

Next, an amorphous semiconductor film that contacts the base film 203 is formed by using a film formation method such as plasma CVD, low pressure CVD, or sputtering. Further, an amorphous semiconductor film contacting the base film 303 is formed. The amorphous semiconductor films are formed having a thickness form 10 to 100 nm, typically 50 nm.

Silicon (Si), germanium (Ge), silicon germanium alloys, and silicon carbide can be used for the amorphous semiconductor films, and in addition, compound semiconductor materials such as gallium arsenide can also be used.

Furthermore, it is possible to form the base films and the amorphous semiconductor film by using the same film formation method, and therefore the base film 202, the base film 203, and in addition, the amorphous semiconductor film may be preferably formed in succession. In this case, the base film 302, the base film 303, and in addition, the amorphous semiconductor film may also be formed in succession. Surface contamination can be prevented after forming the various films by making sure that the respective film surfaces do not come into contact with the atmosphere. As a result, one cause of dispersion in the TFT characteristics can be eliminated.

Figure 7A:
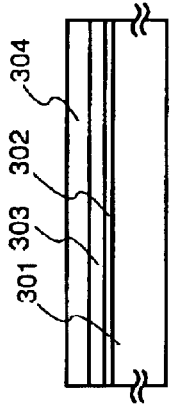
FIGS. 7A to 7D are diagrams showing a process of manufacturing a TEG and an actual panel.

The amorphous semiconductor film is crystallized next using a known crystallization technique, forming a crystalline semiconductor film 204 contacting the base film 203. Further, the other amorphous semiconductor film is crystallized similarly by using a known crystallization technique, forming a crystalline semiconductor film 304 contacting the base film 303 (see FIG. 7A).

Hydrogen is contained in amorphous semiconductor films manufactured by plasma CVD at a ratio of 10 to 40 atom %, and it is preferable to eliminate hydrogen from the inside of the film, reducing the amount of hydrogen contained in the film to 5 atom % or less, by performing the heat treatment process at a temperature of 400 to 500° C. before the crystallization process. Further, the amorphous semiconductor films may also be formed by other film formation methods such as sputtering or evaporation, and it is preferable to sufficiently reduce the amount of impurities such as oxygen and nitrogen contained within the films.

Crystallization by a known solid state grown method such as laser annealing or thermal annealing may be performed for the process of crystallizing the amorphous semiconductor films. Further, crystalline semiconductor films made by a thermal annealing technique using a catalyst element can also be used. In addition, the superior TFT characteristics can be obtained for the crystalline semiconductor films formed by the thermal annealing technique using a catalyst element if a gettering step is added for removing the catalyst element.

In addition, a first laser light (XeCl, wavelength 308 nm) irradiation for improving the crystallinity of the crystalline semiconductor films, and for repairing defects remaining within crystal grains may be performed within the atmosphere or within an oxygen atmosphere. An excimer laser having a wavelength equal to or less than 400 nm, or the second harmonic or the third harmonic of a YAG laser may be used as the laser light. Whichever laser light is employed, pulse laser light repeating at a frequency on the order of 10 to 1000 Hz is used. The laser light is condensed to 100 to 500 mJ/cm² using an optical system, and may be irradiated and scanned over a silicon film surface with an overlap ratio of 90 to 95%. Irradiation of the first laser light having a repetition frequency of 30 Hz and an energy density of 393 mJ/cm² is performed in the atmosphere here. Note that oxide films are formed on the surfaces by the first laser light irradiation because it is performed within the atmosphere or in an oxygen atmosphere. After removing the oxide films formed due to the first laser light irradiation by using dihydrofluoric acid, a second laser light is irradiated within a nitrogen atmosphere or in a vacuum, leveling the surface of the crystalline semiconductor films. Excimer laser light having a wavelength equal to or less than 400 nm, or the second harmonic or the third harmonic of a YAG laser is used for this laser light (the second laser light). The energy density of the second laser light is set larger than the energy density of the first laser light, preferably by 30 to 60 mJ/cm². Irradiation of the second laser light is performed here at a repetition frequency of 30 Hz and an energy density of 453 mJ/cm², and the peak to valley P-V value in the crystalline semiconductor film surface becomes equal to or less than 5 nm.

Note that the laser is not limited to pulse emission lasers. Continuous wave lasers, pulse emission gaseous state lasers, and solid state lasers can also be used. Lasers such as excimer lasers, Ar lasers, and Kr lasers can be given as gaseous state lasers, while YAG lasers, $YVO_4$ lasers, YLF lasers, $YalO_3$ lasers, glass lasers, ruby lasers, alexandrite lasers, Ti:sapphire lasers, and the like can be given as solid state lasers.

Figure 7B:
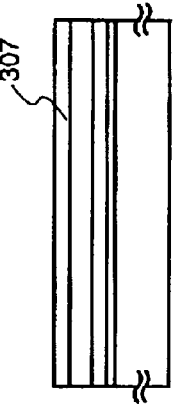

Dry etching of the crystalline semiconductor film 204 in the actual panel is performed next by using a mask, thus forming island shaped semiconductor film 205 and 206 (see FIG. 7B).

A first insulating film 207 having silicon oxide or silicon nitride as its main constituent is then formed on the surfaces of the island shaped semiconductor films 205 and 206. Further, a first insulating film 307 having silicon oxide or silicon nitride as its main constituent is formed on the surface of the crystalline semiconductor film 304. The first insulating films 207 and 307 may be formed by plasma CVD or sputtering, at a film thickness of 10 to 200 nm, preferably between 50 and 150 nm (see FIG. 7C).

A mask 208 is then formed, overlapping with the island shaped semiconductor film 205 and a channel formation regions of the island shaped semiconductor film 206. Furthermore, a mask 308 is formed overlapping with regions other than source and drain regions (including the channel formation region) of the crystalline semiconductor film 304. Although not shown in the drawings, a mask is also formed in regions which form wirings.

The first insulating film 207 is etched using the mask 208, thus forming second insulating films 209 and 210, and exposing portions which serve as the source and drain regions of the island shaped semiconductor film 206. Further, the first insulating film 307 is etched similarly using the mask 308, thus forming second insulating films 309 and 310, and exposing portions that serve as source and drain regions of the crystalline semiconductor film 304 (see FIG. 7D).

An impurity element that imparts an n-type conductivity is then added to the island shaped semiconductor film 210 using the mask 208, thus forming n-type impurity regions 213 and 214. Further, the impurity element that imparts the n-type conductivity is added to the crystalline semiconductor film 304 using the mask 308, thus forming n-type impurity regions 313 and 314.

Phosphorus (P), arsenic (As), antimony (Sb) and the like are known as impurity elements that impart the n-type conductivity to semiconductors, and phosphorus is added here by performing ion doping using phosphine ($PH_3$). Phosphorus is added from exposed portions of the island shaped semiconductor film 206 and the crystalline semiconductor film 304 here. The concentration of phosphorus is set to from $1 \times 10^{19}$ to $1 \times 10^{21}$ atoms/cm³, preferably $1 \times 10^{20}$ atoms/cm³ (see FIG. 8A).

The mask 208 is removed next. Similarly, the mask 308 is also removed. A commercially available alkaline peeling solution may be used in order to remove the masks, and an ashing method may also be used. Ashing is a removal method in which a plasma is formed within an oxygen atmosphere, and the masks, which are hardened resists, are exposed therein. Resist can be effectively removed if water vapor is also added within the atmosphere in addition to oxygen.

A first conductive film 217 is then formed on the substrate 201, covering the second insulating films 209 and 210, and the island shaped semiconductor films 205 and 206. Further, a conductive film 317 is formed on the substrate 301, covering the second insulating films 309 and 310, and the crystalline semiconductor film 304.

The conductive films 217 and 317 are formed from an element selected from the group consisting of Ta, W, Ti, Mo, Al, and Cu, or from an alloy material or a compound material having one of these elements as its main constituent. For example, compounds such as WMo, TaN, MoTa, and $WSi_x$ (where 2.4<x<2.7) can be used. The first conductive films 217 and 317 may be formed having a thickness of 10 to 100 nm, preferably between 150 and 400 nm (see FIG. 8B).

Note that, although a conductive film made from a single layer film is used in Embodiment 1, the present invention is not limited to this structure. A two layer conductive film may also be used for one of the electrode films. In this case, an element selected from the group consisting of Ta, W, Ti, Mo, Al, and Cu, or an alloy material or a compound material having one of these elements as its main constituent, may be formed as the conductive materials forming the two layer conductive film. Specifically, a conductive film in which a tantalum nitride film and a tungsten film are laminated in order can be used. Further, semiconductor films, typically polysilicon films, doped with an impurity element such as phosphorus, and AgPdCu alloys may also be used as a first conductive film and a second conductive film.

Furthermore, the conductive film is not limited to the two layer structure. For example, a three layer structure in which a tungsten film, an alloy film of aluminum and silicon (Al—Si), and a titanium nitride film are laminated in order may also be used. In addition, tungsten nitride may also be used as a substitute for tungsten, and an aluminum and titanium (Al—Ti) alloy film may also be used as a substitute for the aluminum and silicon (Al—Si) alloy film, and a titanium film may also be used as a substitute for the titanium nitride film if a three layer structure is employed.

Note that it is very important to select an optimal etching method, and etchant type, in accordance with the conductive film materials.

A mask 218 is formed next in the actual panel. The mask 218 overlaps with a portion that serves as the channel formation region of the island shaped semiconductor film 205, and overlaps with the entire island shaped semiconductor film 206.

The first conductive film 217 is then etched using the mask 218, thus forming a gate electrode 219 and a second conductive film 220 (see FIG. 8C). An ashing process may also be used for cases in which residue remains after etching. Note that exposed portions of the second insulating film 209 not overlapped by the mask 218 may also be etched, exposing the island shaped semiconductor film 206.

The mask 218 is left as is, an impurity element that imparts a p-type conductivity is added to a portion of the island shaped semiconductor film 206 which forms a p-channel TFT, thus forming p-type impurity regions 221 and 222 (see FIG. 8D). Boron (B), aluminum (Al), and gallium (Ga) are known as the p-type conductivity imparting impurity elements, and boron is added here by ion doping using diborane ($B_2H_6$). Note that the acceleration voltage is increased slightly for cases in which the impurity is added to the island shaped semiconductor film through the second insulating film 209. Boron is added at a concentration of $2 \times 10^{20}$ atoms/cm$^3$ using an acceleration voltage of 80 keV in Embodiment 1.

Figure 9A:
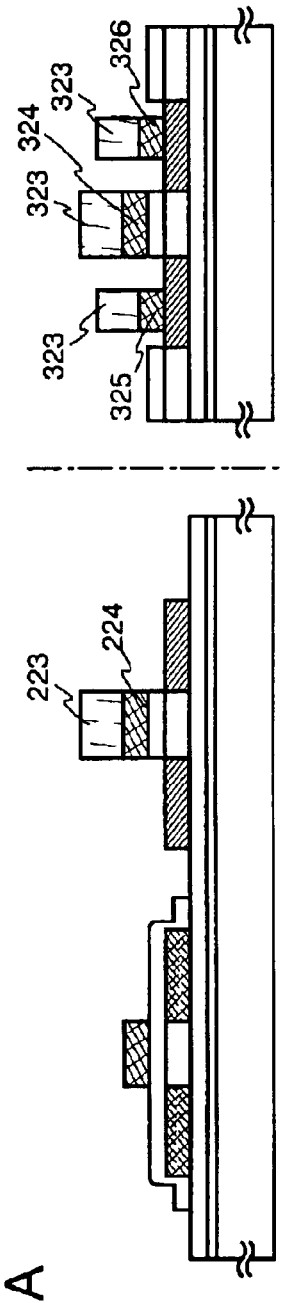
FIGS. 9A to 9C are diagrams showing the process of manufacturing a TEG and an actual panel.

After removing the mask 218, a mask 223 is formed in a position that overlaps with a channel formation region of the island shaped semiconductor film 206. The second conductive film 220 is etched using the mask 223, thus forming a gate electrode 224. Further, a mask 323 is formed in the TEG as well, overlapping with regions other than the source and drain regions of the crystalline semiconductor film 304 (including a channel formation region). The first conductive film 317 is etched using the mask 323, thus forming a gate electrode 324, a source electrode 325, and a drain electrode 336 (see FIG. 9A).

An n-channel TFT 230 and a p-channel TFT 231 are then completed in the actual panel by removing the mask 218. Further, an n-channel TFT 330 is completed in the TEG by removing the mask 323 (see FIG. 9B). Note that FIG. 9C is a top view of the state of FIG. 9B, and corresponds to a cross sectional diagram along a dashed line segment A–A' and a cross sectional diagram along a dashed line segment B–B'. In order to display the structure clearly, the second insulating film 209 is omitted from the p-channel TFT 231.

Figure 9B:
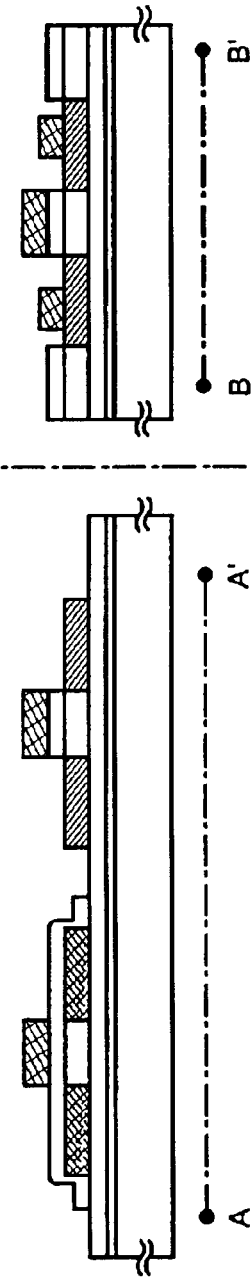
Figure 9C:
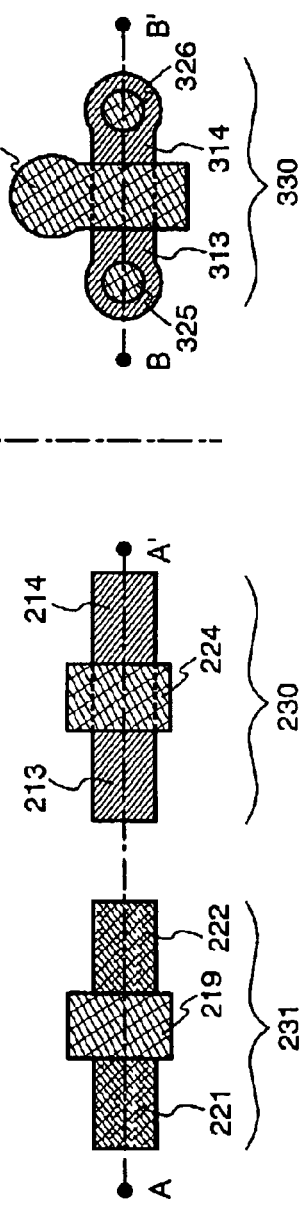

Note that probes are attached to the gate electrode 324, the source electrode 325, and the drain electrode 326 in the n-channel TFT 330 of the TEG after completing the processes of FIG. 9B. The characteristics are then examined by making electric current flow, and applying voltage.

For cases in which the characteristics are not preferable found in the examination, separate processes are added in order to improve the characteristics of the actual panel TFTs, and an yield can be increased. Further, it is possible to omit further processing relating to the panel if it is determined that the actual panel is not able to withstand the service as a finished product. Time and costs required in the manufacturing process can thus be controlled. Further, the TEG characteristics can be fed back to subsequent lots of actual panels. Specifically, the processing conditions of subsequent lots can be reconsidered, and other processes for improving the TFT characteristics can be added.

Processing may continue as is for cases in which it is determined that there are no problems predicted in the characteristics of the actual panel after examination.

[Embodiment 2]

A process of manufacturing that differs from that of Embodiment 1 is explained in Embodiment 2 using FIGS. 10A to 10D.

First, according to the description of Embodiment 1, the manufacturing process is performed for obtaining up through the state of FIG. 8B. Note that the state of FIG. 8B corresponds to that of FIG. 10A in this embodiment.

After the first conductive film 217 is formed, a mask 240 is formed on the first conductive film 217 so as to overlap with the channel formation region of the island shaped semiconductor film 205 and the channel formation region of the island shaped semiconductor film 206, as shown in FIG. 10A. Further, a mask 340 is formed on the conductive film 317 so as to overlap with the channel formation region of the crystalline semiconductor film 304.

The first conductive film 217 is then etched using the mask 240, thus forming gate electrodes 241 and 242. Further, the first conductive film 317 is etched using the mask 340, thus forming a gate electrode 341, source electrodes 342 and 343 (see FIG. 10B). An ashing process may be performed here for cases in which residue remains after etching.

The mask 240 in the actual panel is removed next, and a mask 243 is formed covering the island shaped semiconductor film 206. An impurity element that imparts a p-type conductivity is then added to a portion of the island shaped semiconductor film 206 forming the p-channel TFT, thus forming p-channel impurity regions 244 and 245 (see FIG. 10C). Boron (B), aluminum (Al), and gallium (Ga) are known as impurity elements that impart the p-type conductivity, and boron is added here by ion doping using diborane ($B_2H_6$). Note that the acceleration voltage is increased slightly for cases in which the impurity is added to the island shaped semiconductor film through the second insulating film 209. Boron is added at a concentration of $2 \times 10^{20}$ atoms/cm$^3$ using an acceleration voltage of 80 keV in Embodiment 2.

Next, removing the mask 243 in the actual panel completes an n-channel TFT 250 and a p-channel TFT 251. Further, removing the mask 340 completes an n-channel TFT 350 in the TEG.

Probes are attached to the gate electrode 341, the source electrode 342, and the drain electrode 343 in the n-channel TFT 350 of the TEG once the TEG is completed. The TEG characteristics are examined by making electric current flow and applying voltage.

For cases in which the characteristics are not preferable found in the examination, separate processes can be added in order to improve the characteristics of the actual panel TFTs, and the yield can be increased. Further, it is possible to omit later processes relating to the actual panel if it is determined that the panel cannot stand up to being used as a finished manufactured product, and time and costs relating to the manufacturing processes can be controlled. The TEG characteristics can also be fed back to subsequent lots of actual panels. Specifically, the manufacturing conditions of the subsequent lots can be reconsidered, and separate processes can be added in order to improve the TFT characteristics.

If it is determined in the examination that there are no expected problems with the actual panels, then further processing may be continued as is.

[Embodiment 3]

A process of manufacturing that differs from that of Embodiments 1 and 2 is explained in Embodiment 3 using FIGS. 11A to 12C.

Figure 7C:
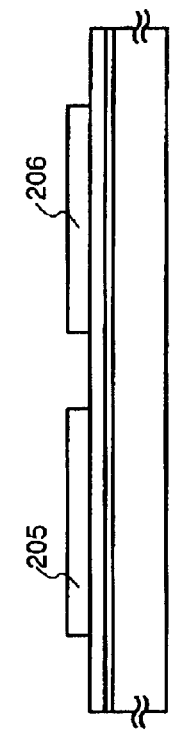
Figure 7D:
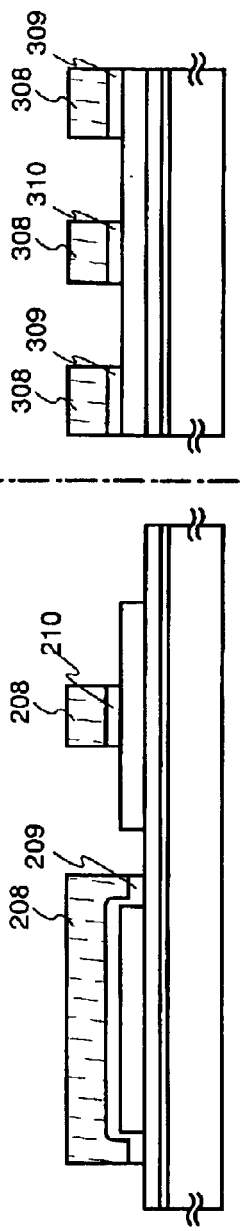

First, according to the description of Embodiment 1, the manufacturing process is performed for obtaining up through the state of FIG. 7C. Note that the state of FIG. 7C corresponds to that of FIG. 11A in this embodiment.

After the first conductive film 207 is formed, a mask 260 is formed on the first conductive film 207 so as to overlap with the channel formation region of the island shaped semiconductor film 205 and the entire island shaped semiconductor film 206 in the actual panel, as shown in FIG. 11A.

An impurity element that imparts a p-type conductivity is then added to a portion of the island shaped semiconductor film 206 that forms a p-channel TFT by using the mask 260, thus forming p-type impurity regions 261 and 262 (see FIG. 11B). Boron (B), aluminum (Al), and gallium (Ga) are known as impurity elements that impart the p-type conductivity, and boron is added here by ion doping using diborane ($B_2H_6$). Note that the acceleration voltage is increased slightly for cases in which the impurity is added to the island shaped semiconductor film through the first insulating film 207. Boron is added at a concentration of $2\times10^{20}$ atoms/cm$^3$ using an acceleration voltage of 80 keV in Embodiment 3.

After removing the mask 260, a mask 263 is formed on the first insulating film 207 so as to overlap with the channel formation region of the island shaped semiconductor film 205 and the channel formation region of the island shaped semiconductor film 206. Further, a mask 363 is formed overlapping regions other than the source and drain regions (including the channel formation region) of the crystalline semiconductor film 304.

The first insulating film 207 is then etched using the mask 263, forming second insulating films 264 and 265 and exposing portions of the island shaped semiconductor film 205 and the island shaped semiconductor film 206 not overlapping with the mask 263. Further, the first insulating film 307 is etched using the mask 363, forming second insulating films 364 and 365, and exposing portions of the crystalline semiconductor film 304 not overlapping with the mask 363 (see FIG. 11C).

The mask 263 is removed next, and a mask 266 is formed overlapping with the entire island shaped semiconductor film 205 and the channel formation region of the island shaped semiconductor film 206. Further, the mask 363 is removed, and a mask 366 is formed overlapping with regions other than the source and drain regions (including the channel formation region) of the crystalline semiconductor film 304.

An impurity element that imparts an n-type conductivity is then added to the semiconductor film 206 using the mask 266, thus forming n-type impurity regions 267 and 268. Further, the impurity element that imparts the n-type conductivity is added to the crystalline semiconductor film 304 using the mask 363, thus forming n-type impurity regions 367 and 368.

Phosphorus (P), arsenic (As), antimony (Sb) and the like are known as impurity elements that impart the n-type conductivity to semiconductors, and phosphorus is added here by performing ion doping using phosphine ($PH_3$). Phosphorus is added from exposed portions of the island shaped semiconductor film 206 and the crystalline semiconductor film 304 here. The concentration of phosphorus is preferably set to from $1\times10^{19}$ to $1\times10^{21}$ atoms/cm$^3$, and it is set to $1\times10^{20}$ atoms/cm$^3$ here (see FIG. 11D).

The mask 266 is then removed, and a first conductive film 269 is formed on the substrate 201, covering the island shaped semiconductor films 205 and 206, and the second insulating films 264 and 265. Further, the mask 366 is removed, and a first conductive film 269 is formed on the substrate 201, covering the crystalline semiconductor film 304 and the second insulating films 364 and 365 (see FIG. 12A).

The materials described in Embodiment 1 can be used for the first conductive film.

A mask 270 is formed next on the first conductive film 269 so as to overlap with the channel formation regions of the island shaped semiconductor films 205 and 206. Further, a mask 370 is formed on the first conductive film 369 so as to overlap with regions other than the source and drain regions (including the channel formation region) of the crystalline semiconductor film 304.

The first conductive film 269 is then etched using the mask 270, thus forming gate electrodes 271 and 272. Further, the first conductive film 369 is etched using the mask 370, thus forming a gate electrode 371, a source electrode 372, and a drain electrode 373 (see FIG. 12B). An ashing process may be performed here for cases in which residue remains after etching.

Next, removing the mask 270 in the actual panel completes an n-channel TFT 280 and a p-channel TFT 281. Further, removing the mask 370 completes an n-channel TFT 380 in the TEG.

Probes are attached to the gate electrode 371, the source electrode 372, and the drain electrode 373 in the n-channel TFT 380 of the TEG once the TEG is completed. The TEG characteristics are examined by making electric current flow and applying voltage.

For cases in which the characteristics are not preferable found in the examination, separate processes can be added in order to improve the characteristics of the actual panel TFTs, and the yield can be increased. Further, it is possible to omit later processes relating to the actual panel if it is determined that the panel cannot stand up to being used as a finished manufactured product, and time and costs relating to the manufacturing processes can be controlled. The TEG characteristics can also be fed back to subsequent lots of actual panels. Specifically, the manufacturing conditions of the subsequent lots can be reconsidered, and separate processes can be added in order to improve the TFT characteristics.

If it is determined in the examination that there are no expected problems with the actual panels, then further processing may be continued as is.

[Embodiment 4]

In this embodiment, a case of forming a semiconductor film by a thermal crystallization method using a catalytic element is described.

When the catalytic element is used, it is preferable to use the technique disclosed in Japanese Patent Application Laid-Open No. 7-130652 or 8-78329.

Here, the state of crystallization of the semiconductor film using the technique disclosed in Japanese Patent Application Laid Open No. 7-130652 is shown in FIG. 13.

Figure 13A:
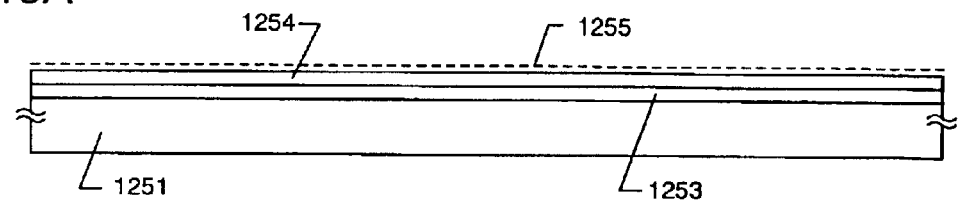
FIGS. 13A and 13B are diagrams showing a process of crystallizing a semiconductor film.

First, a base film 1253 is formed on a substrate 1251, moreover, an amorphous semiconductor film 1254 is formed on that. Further, a nickel acetate solution containing nickel of 10 ppm in weight terms is coated on the resultant substrate to thereby form a nickel containing layer 1255 (FIG. 13A). A base film 1253 is not formed necessarily.

Figure 13B:
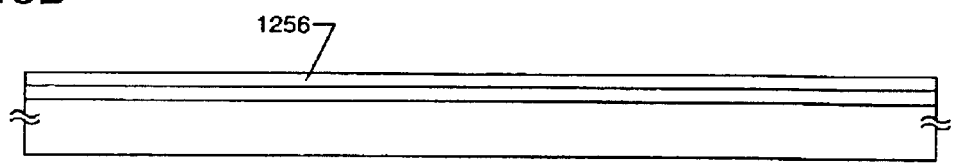

Next, after a dehydrogenation step at a temperature of 500° C. for 1 hour, a heat treatment is conducted at a temperature of 500 to 650° C. for 4 to 12 hours, e.g., at 550° C. for 8 hours, thereby forming a crystalline semiconductor film 1256. The crystalline semiconductor film 1256 thus obtained exhibits excellent crystallinity (FIG. 13B).

Meanwhile, according to the technique disclosed in Japanese Patent Application Laid-Open No. 8-78329, an amorphous semiconductor film can be selectively crystallized by selectively adding a catalytic element thereto. The state of the crystallization of a semiconductor film applying this technique is described in the FIG. 14.

First, a base film 1303 is formed on a glass substrate 1301, moreover, an amorphous semiconductor film 1304 is formed on that. The base film 1303 is not formed necessarily. A silicon oxide film 1305 is continuously formed on the amorphous semiconductor film 1304. At this moment, the thickness of the silicon oxide film 1305 is 150 nm.

Figure 14A:
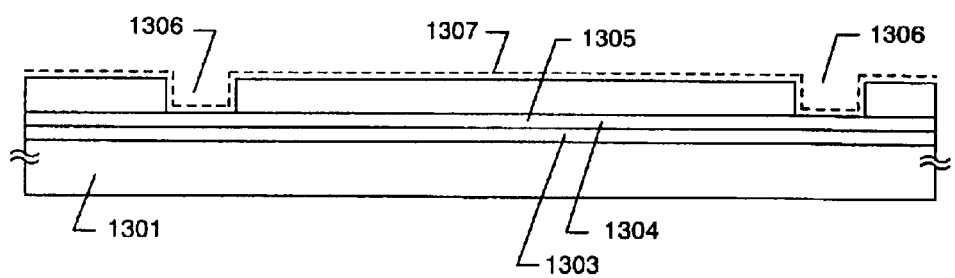
FIGS. 14A and 14B are diagrams showing the process of crystallizing a semiconductor film.

Next, the silicon oxide film 1305 is patterned to thereby selectively form contact holes 1306 and a nickel acetate solution containing nickel of 10 ppm in weight terms is coated on the resultant substrate. As a result, a nickel containing layer 1307 is formed. The nickel containing layer 1307 contacts with the amorphous semiconductor film 1304 only at the bottoms of the contact holes 1306 (FIG. 14A).

Figure 14B:
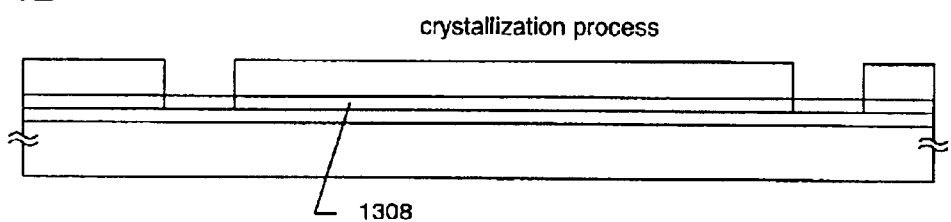

Thereafter, a heat treatment is carried out at a temperature of 500 to 650° C. for 4 to 24 hours, e.g., at 570° C. for 14 hours, thereby forming a crystalline semiconductor film 1308. In this crystallization process, parts of the amorphous semiconductor film which contact with nickel are first crystallized and the crystallization proceeds therefrom in lateral direction. The crystalline semiconductor film 1308 thus formed is constituted so that stick-like or needle-like crystals are collected together. Since each crystal grows with a certain directivity macroscopically, the crystalline silicon film 1308 is advantageous of having uniform crystallinity (FIG. 14B).

The catalytic element available in the above-mentioned two techniques may be germanium (Ge), iron (Fe), palladium (Pd), tin (Sn), lead (Pb), cobalt (Co), platinum (Pt), copper (Cu) or gold (Au) in place of nickel (Ni).

By forming the crystalline semiconductor film using one of the above-mentioned techniques and patterning the crystalline semiconductor film, a semiconductor layer of a crystalline TFT can be formed. Although the TFT formed out of the crystalline semiconductor film by the technique described in this embodiment exhibits excellent characteristics, it is required to ensure high reliability, accordingly. However, by adopting the TFT structure of the present invention, it is possible to manufacture a TFT while making the most use of the technique in this embodiment.

Figure 15A:
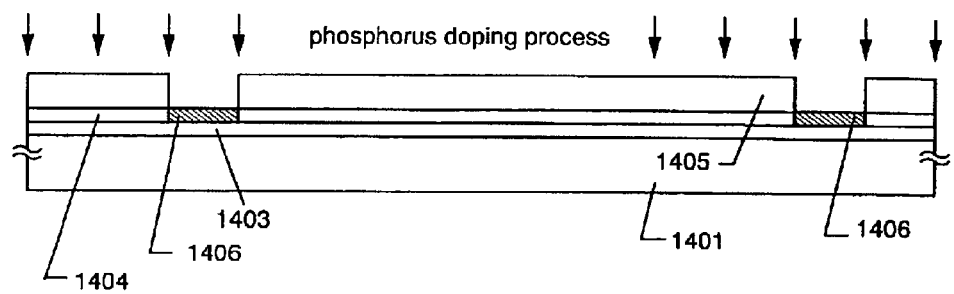
FIGS. 15A and 15B are diagrams showing the process of crystallizing a semiconductor film.
Figure 15B:
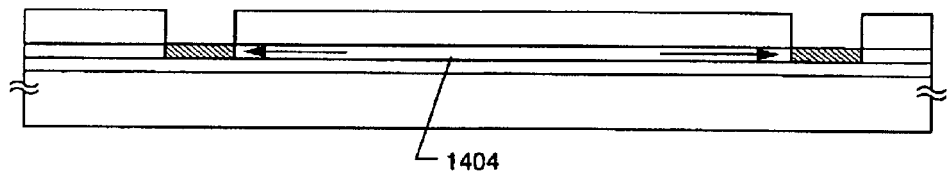

Next, a case of executing steps of forming a crystalline semiconductor film using an amorphous semiconductor film as an initial film and using the catalytic element mentioned above, and then removing the catalytic element from the crystalline semiconductor film, will be described with reference to FIG. 15. In this embodiment, the steps are executing using the technique described in Japanese Patent Application Laid-Open No. 10-135468 or 10-135469.

The technique described therein is for removing a catalytic element used to crystallize an amorphous semiconductor film using the gettering action of phosphorus after the crystallization. By utilizing this technique, it is possible to decrease the concentration of the catalytic element in the crystalline semiconductor film to lower than $1 \times 10^{17}$ atms/cm$^3$, preferably $1 \times 10^{16}$ atms/cm$^3$.

In this embodiment, a no-alkali glass substrate represented by a 1737 substrate manufactured by Corning Inc. is used. As shown in FIG. 15A, a base film 1403 is formed on the substrate 1401 and then an amorphous semiconductor film 1404 is formed on that. A base film 1403 is not formed necessarily.

A silicon oxide film 1405 having a thickness of 150 nm is formed on the surface of the crystalline semiconductor film 1404 as a mask, contact holes are formed by patterning and regions in which part of the crystalline semiconductor film 1404 is exposed are provided. Thereafter, a step of adding phosphorus is executed to thereby provide a region 1406 in which phosphorus is added to the crystalline semiconductor film.

In this state, if a heat treatment is carried out at a temperature of 550 to 800° C. for 5 to 24 hours, e.g., 600° C. for 12 hours in a nitrogen atmosphere, the region 1406 in which phosphorus is added to the crystalline semiconductor film 1404 functions as a gettering site, making it possible to segregate the catalytic element remaining in the crystalline semiconductor film 1404 to the gettering region 1406 in which phosphorus is added to the crystalline silicon film 1404.

The oxide silicon film 1405 serving as a mask and the phosphorus-added region 1406 are etched away, whereby the crystalline semiconductor film having the concentration of the catalytic element, used in the crystallization step, decreased to less than $1 \times 10^{17}$ atms/cm$^3$ can be obtained. The TFT can be obtained by using this crystalline semiconductor film.

This embodiment can be carried out in free combination with Embodiments 1 to 3.

[Embodiment 5]

A TEG for monitoring the resistance between source and drain regions is explained in Embodiment 5.

Figure 16A:
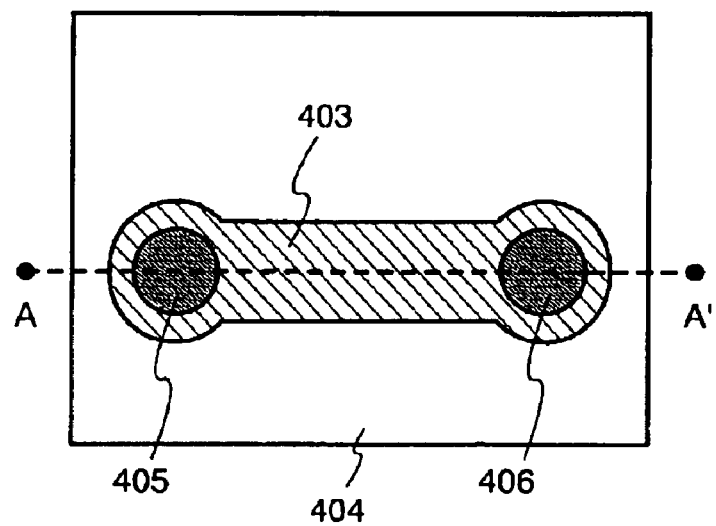
FIGS. 16A and 16B are diagrams showing the structure of a TEG for measuring the resistance between a source and a drain.
Figure 16B:
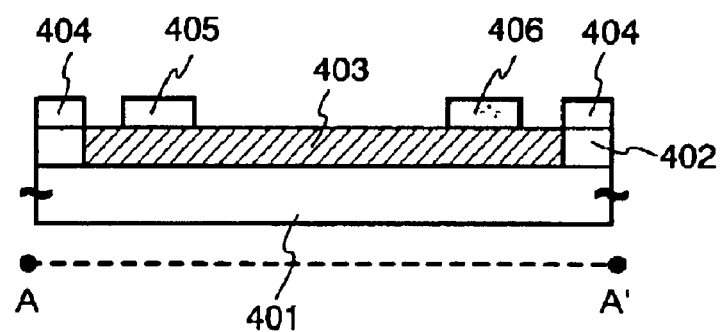

A top view and a cross sectional diagram of the TEG of Embodiment 5 are shown in FIGS. 16A and 16B, respectively. A cross sectional diagram taken along a dotted line segment A–A' in the top view of FIG. 16A corresponds to the cross sectional diagram of FIG. 16B.

A semiconductor film 402 is formed on a substrate 401 in the TEG shown in FIGS. 16A and 16B. An impurity region 403, to which an impurity that imparts a conductivity is added, is formed in the semiconductor film 402.

Further, an insulating film 404 is formed so as to contact the semiconductor film 402. A portion of the insulating film 404 is etched so as to expose the impurity region 403, thus forming an opening portion.

A source electrode 405 and a drain electrode 406 are formed in the portion where the impurity region 403 is exposed, so as to contact the impurity region 403.

Note that the TEG disclosed in Embodiment 5 is one for monitoring the resistance between source and drain regions of an actual panel. It is therefore preferable that processes among those used for manufacturing thin film transistors being thought to have a large influence on the resistance between the source and drain regions, specifically a process of crystallizing a semiconductor film, and a process of adding an impurity to the semiconductor film to form an impurity region, have the same conditions of manufacture for the actual panel and the TEG. The relative dispersion in the characteristics of the TEG can be made to more certainly have good agreement with the relative dispersion in the actual panel characteristics by using the same manufacturing conditions for the actual panel and the TEG.

It is possible to implement Embodiment 5 in combination with Embodiments 1 to 4.

[Embodiment 6]

An actual top view of a TEG of the present invention is shown in Embodiment 6.

Figure 17A:
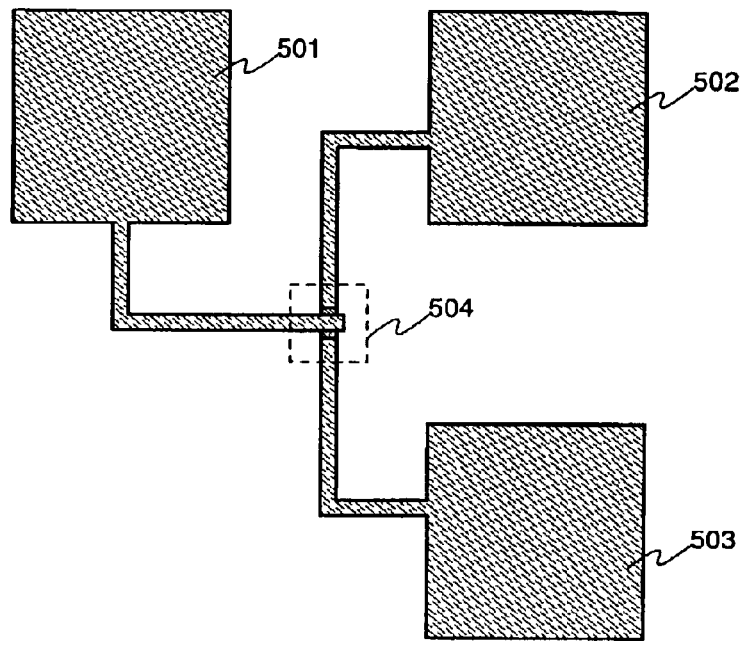
FIGS. 17A to 17C are TEG masking diagrams.

A top view of the TEG of Embodiment 6 is shown in FIG. 17A. Reference numeral 501 denotes a pad (terminal) for applying voltage to gate electrodes, and reference numerals 502 and 503 denote pads for applying voltage to source or drains. Measurement probes are attached to the pads, and voltage is applied.

Figure 17B:
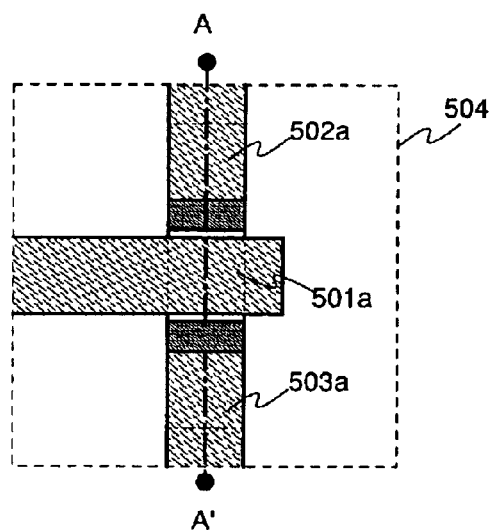

FIG. 17B shows a blow-up diagram of a portion 504 of FIG. 17A enclosed by a dashed line. Reference numeral 501a in FIG. 17B denotes a gate electrode that is electrically connected to the pad 501. Reference numerals 502a and 503a denote a source electrode and a drain electrode that are electrically connected to the pads 502 and 503, respectively.

Figure 17C:
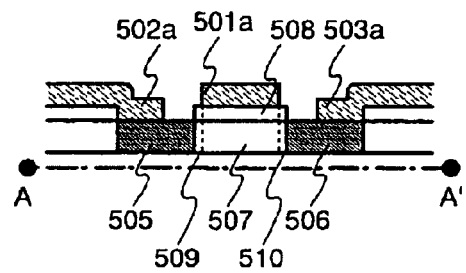

A cross sectional diagram taken along a dotted line segment A–A' of FIG. 17B is shown in FIG. 17C. The source electrode 502a and the drain electrode 503a contact a source region 505 and a drain region 506, respectively. A channel formation region 507 is sandwiched by the source region 505 and the drain region 506. The gate electrode 501a overlaps with the channel formation region 507, sandwiching a gate insulating film 508 therebetween.

Note that regions (offset regions) 509 and 510 that do not overlap with the gate electrode 508 exist between the channel formation region 507 and the source electrode 505, and between the channel formation region 507 and the drain electrode 506, respectively, in Embodiment 6. Although it is not always necessary to form the offset regions, contact between the gate electrode 501a and the source region 505 or the drain region 506 due to mask displacement can be prevented by forming the offset regions.

It is possible to implement Embodiment 6 in combination with Embodiments 1 to 5.

According to the present invention, it is possible to manufacture a TEG by using fewer processing steps than those used for an actual panel, and therefore it is possible to complete TFTs for TEG more quickly than those of the actual panel. It thus becomes possible to feed back an evaluation of the TFT characteristics of the TEG to the process of manufacturing the actual panel at an early stage. The time and costs relating to the panel manufacturing processes can therefore be suppressed.

What is claimed is:

1. A method of evaluating a semiconductor device by evaluating from characteristics of first thin film transistors contained in a first panel, characteristics of second thin film transistors contained in a second panel of the semiconductor device,
wherein:
the first thin film transistors are formed by fewer processing steps than the second thin film transistors;
a process of manufacturing the first thin film transistors and a process of manufacturing the second thin film transistors both comprising:
forming a semiconductor film;
forming an insulating film in contact with the semiconductor film;
etching the insulating film so as to expose a portion of the semiconductor film;
adding an impurity to the semiconductor film, thereby forming a channel region and impurity regions in contact with the channel region;
forming a conductive film so as to cover the semiconductor film and the insulating film; and
etching the conductive film, thereby forming an electrode over the channel region with the insulating film interposed therebetween,
wherein a first panel and a second panel belong to a same lot in at least one of the manufacturing processes, and
wherein two electrodes in contact with the impurity regions are formed at the same time in the first thin film transistors at the step of forming the electrode over the channel region,
whereby a dispersion in the respective characteristics of the second thin film transistors contained in the second panel is evaluated from a dispersion in the respective characteristics of the first thin film transistors contained in the first panel.

2. A method of evaluating a semiconductor device by evaluating from characteristics of first thin film transistors contained in a first panel, characteristics of second thin film transistors contained in a second panel of the semiconductor device,
wherein:
the first thin film transistors are formed by fewer processing steps than the second thin film transistors;
a process of manufacturing the first thin film transistors and a process of manufacturing the second thin film transistors both comprising:
forming a semiconductor film;
crystallizing the semiconductor film;
forming an insulating film in contact with the crystallized semiconductor film;
etching the insulating film so as to expose a portion of the crystallized semiconductor film;
adding an impurity to the crystallized semiconductor film, thereby forming a channel region and impurity regions in contact with the channel region;
forming a conductive film so as to cover the crystallized semiconductor film and the insulating film; and
etching the conductive film, thereby forming an electrode over the channel region with the insulating film interposed therebetween,
wherein a first panel and a second panel belong to a same lot in at least one of the manufacturing processes, and
wherein two electrodes in contact with the impurity regions are formed at the same time in the first thin film transistors at the step of forming the electrode over the channel region,
whereby a dispersion in the respective characteristics of the second thin film transistors contained in the second panel is evaluated from a dispersion in the respective characteristics of the first thin film transistors contained in the first panel.

3. A method of evaluating a semiconductor device by evaluating from characteristics of first thin film transistors contained in a first panel, characteristics of second thin film transistors contained in a second panel of the semiconductor device,
wherein:
the first thin film transistors are formed by fewer processing steps than the second thin film transistors;
a process of manufacturing the first thin film transistors and a process of manufacturing the second thin film transistors both comprising:
forming a semiconductor film;
etching the semiconductor film so as to form an island shaped semiconductor film;
forming an insulating film in contact with the island shaped semiconductor film;
etching the insulating film so as to expose a portion of the island shaped semiconductor film;
adding an impurity to the island shaped semiconductor film, thereby forming a channel region and impurity regions in contact with the channel region;
forming a conductive film so as to cover the island shaped semiconductor film and the insulating film; and
etching the conductive film, thereby forming an electrode over the channel region with the insulating film interposed therebetween,
wherein a first panel and a second panel belong to a same lot in at least one of the manufacturing processes, and wherein two electrodes in contact with the impurity regions are formed at the same time in the first thin film transistors at the step of forming the electrode over the channel region, whereby a dispersion in the respective characteristics of the second thin film transistors contained in the second panel is evaluated from a dispersion in the respective characteristics of the first thin film transistors contained in the first panel.

4. A method of evaluating a semiconductor device by evaluating from characteristics of first thin film transistors contained in a first panel, characteristics of second thin film transistors contained in a second panel of the semiconductor device, wherein:
the first thin film transistors are formed by fewer processing steps than the second thin film transistors;
a process of manufacturing the first thin film transistors and a process of manufacturing the second thin film transistors both comprising:
forming a semiconductor film;
crystallizing the semiconductor film;
etching the crystallized semiconductor film so as to form an island shaped semiconductor film;
forming an insulating film in contact with the island shaped semiconductor film;
etching the insulating film so as to expose a portion of the island shaped semiconductor film;
adding an impurity to the island shaped semiconductor film, thereby forming a channel region and impurity regions in contact with the channel region;
forming a conductive film so as to cover the semiconductor film and the insulating film; and
etching the conductive film, thereby forming an electrode over the channel region with the insulating film interposed therebetween, wherein a first panel and a second panel belong to a same lot in at least one of the manufacturing processes, and wherein two electrodes in contact with the impurity regions are formed at the same time in the first thin film transistors at the step of forming the electrode over the channel region, whereby a dispersion in the respective characteristics of the second thin film transistors contained in the second panel is evaluated from a dispersion in the respective characteristics of the first thin film transistors contained in the first panel.

5. A method of evaluating a semiconductor device by evaluating from characteristics of a first thin film transistor contained in the semiconductor device, characteristics of a second thin film transistor contained in the semiconductor device, wherein:
the first thin film transistor and the second thin film transistor are formed over a same substrate;
the first thin film transistor is formed by fewer processing steps than the second thin film transistor;
a process of manufacturing the first thin film transistor and a process of manufacturing the second thin film transistor both comprising:
forming a semiconductor film;
forming an insulating film in contact with the semiconductor film;
etching the insulating film so as to expose a portion of the semiconductor film;
adding an impurity to the semiconductor film so as to form a channel region and impurity regions in contact with the channel region;
forming a conductive film so as to cover the semiconductor film and the insulating film; and
etching the conductive film, thereby forming an electrode over the channel region with the insulating film interposed therebetween, wherein two electrodes in contact with the impurity regions are formed at the same time in the first thin film transistor at the step of forming the electrode over the channel region, whereby a dispersion in the characteristics of the second thin film transistor is evaluated from a dispersion in the characteristics of the first thin film transistor.

6. A method of evaluating a semiconductor device by evaluating from characteristics of a first thin film transistor contained in the semiconductor device, characteristics of a second thin film transistor contained in the semiconductor device, wherein:
the first thin film transistor and the second thin film transistor are formed over a same substrate;
the first thin film transistor is formed by fewer processing steps than the second thin film transistor;
a process of manufacturing the first thin film transistor and a process of manufacturing the second thin film transistor both comprising:
forming a semiconductor film;
crystallizing the semiconductor film;
forming an insulating film in contact with the crystallized semiconductor film;
etching the insulating film so as to expose a portion of the crystallized semiconductor film;
adding an impurity to the crystallized semiconductor film so as to form a channel region and impurity regions in contact with the channel region;
forming a conductive film so as to cover the crystallized semiconductor film and the insulating film; and
etching the conductive film, thereby forming an electrode over the channel region with the insulating film interposed therebetween, wherein two electrodes in contact with the impurity regions are formed at the same time in the first thin film transistor at the step of forming the electrode over the channel region, whereby a dispersion in the characteristics of the second thin film transistor is evaluated from a dispersion in the characteristics of the first thin film transistor.

7. A method of evaluating a semiconductor device by evaluating from characteristics of a first thin film transistor contained in the semiconductor device, characteristics of a second thin film transistor contained in the semiconductor device, wherein:
the first thin film transistor and the second thin film transistor are formed over a same substrate;
the first thin film transistor is formed by fewer processing steps than the second thin film transistor;
a process of manufacturing the first thin film transistor and a process of manufacturing the second thin film transistor both comprising:
forming a semiconductor film;
etching the semiconductor film so as to form an island shaped semiconductor film;

forming an insulating film in contact with the island shaped semiconductor film;

etching the insulating film so as to expose a portion of the island shaped semiconductor film;

adding an impurity to the island shaped semiconductor film so as to form a channel region and impurity regions in contact with the channel region;

forming a conductive film so as to cover the island shaped semiconductor film and the insulating film; and etching the conductive film, thereby forming an electrode over the channel region with the insulating film interposed therebetween, wherein two electrodes in contact with the impurity regions are formed at the same time in the first thin film transistor at the step of forming the electrode over the channel region, whereby a dispersion in the characteristics of the second thin film transistor is evaluated from a dispersion in the characteristics of the first thin film transistor.

8. A method of evaluating a semiconductor device by evaluating from characteristics of a first thin film transistor contained in the semiconductor device, characteristics of a second thin film transistor contained in the semiconductor device, wherein:
the first thin film transistor and the second thin film transistor are formed over a same substrate;
the first thin film transistor is formed by fewer processing steps than the second thin film transistor;

a process of manufacturing the first thin film transistor and a process of manufacturing the second thin film transistor both comprising:

forming a semiconductor film;

crystallizing the semiconductor film;

etching the crystallized semiconductor film so as to form an island shaped semiconductor film;

forming an insulating film in contact with the island shaped semiconductor film;

etching the insulating film so as to expose a portion of the island shaped semiconductor film;

adding an impurity to the island shaped semiconductor film so as to form a channel region and impurity regions in contact with the channel region;

forming a conductive film so as to cover the island shaped semiconductor film and the insulating film; and etching the conductive film, thereby forming an electrode over the channel region with the insulating film interposed therebetween, wherein two electrodes in contact with the impurity regions are formed at the same time in the first thin film transistor at the step of forming the electrode over the channel region, whereby a dispersion in the characteristics of the second thin film transistor is evaluated from a dispersion in the characteristics of the first thin film transistor.

* * * * *